United States Patent
Erk et al.

(10) Patent No.: US 10,475,696 B2
(45) Date of Patent: Nov. 12, 2019

(54) METHOD OF MANUFACTURE OF A SEMICONDUCTOR ON INSULATOR STRUCTURE

(71) Applicant: SunEdison Semiconductor Limited (UEN201334164H), Singapore (SG)

(72) Inventors: Henry Frank Erk, St. Louis, MO (US); Sasha Kweskin, St. Louis, MO (US); Jeffrey L. Libbert, O'Fallon, MO (US); Mayank Bulsara, Weston, MA (US)

(73) Assignee: SunEdison Semiconductor Limited (UEN201334164H), Singapore (SG)

( * ) Notice: Subject to any disclaimer, the term of this patent is extended or adjusted under 35 U.S.C. 154(b) by 0 days.

(21) Appl. No.: 16/001,377

(22) Filed: Jun. 6, 2018

(65) Prior Publication Data

US 2019/0019721 A1    Jan. 17, 2019

Related U.S. Application Data

(60) Provisional application No. 62/532,417, filed on Jul. 14, 2017.

(51) Int. Cl.
*H01L 21/762* (2006.01)
*H01L 21/02* (2006.01)
*H01L 21/306* (2006.01)
*H01L 21/3065* (2006.01)

(52) U.S. Cl.
CPC .. *H01L 21/76254* (2013.01); *H01L 21/02274* (2013.01); *H01L 21/3065* (2013.01); *H01L 21/30604* (2013.01)

(58) Field of Classification Search
CPC ......... H01L 21/76254; H01L 21/02274; H01L 21/30604; H01L 21/3065
See application file for complete search history.

(56) References Cited

U.S. PATENT DOCUMENTS

| | | |
|---|---|---|
| 4,501,060 A | 2/1985 | Frye et al. |
| 4,755,865 A | 7/1988 | Wilson et al. |
| 4,968,384 A | 11/1990 | Asano |
| 5,189,500 A | 2/1993 | Kusunoki |
| 6,043,138 A | 3/2000 | Ibok |
| 6,373,113 B1 | 4/2002 | Gardner et al. |
| 6,562,127 B1 | 5/2003 | Kud et al. |
| 6,624,047 B1 | 9/2003 | Sakaguchi et al. |
| 6,653,209 B1 * | 11/2003 | Yamagata ......... H01L 21/02052 257/E21.563 |

(Continued)

FOREIGN PATENT DOCUMENTS

| | | |
|---|---|---|
| EP | 0939430 A2 | 1/1999 |
| EP | 1865551 A1 | 12/2007 |

(Continued)

OTHER PUBLICATIONS

International Search Report and Written Opinion issued for PCT/US2018/036091, dated Sep. 12, 2018 (16 pages).

(Continued)

*Primary Examiner* — Fernando L Toledo
*Assistant Examiner* — Neil R Prasad
(74) *Attorney, Agent, or Firm* — Armstrong Teasdale LLP

(57) ABSTRACT

A method is provided for preparing a semiconductor-on-insulator structure comprising a multilayer dielectric layer.

30 Claims, 9 Drawing Sheets

(56) References Cited

U.S. PATENT DOCUMENTS

| | | |
|---|---|---|
| 7,868,419 B1 | 1/2011 | Kerr et al. |
| 7,879,699 B2 | 2/2011 | Schulze et al. |
| 7,915,716 B2 | 3/2011 | Pisigan et al. |
| 8,058,137 B1 | 11/2011 | Or-Bach et al. |
| 8,076,750 B1 | 12/2011 | Kerr et al. |
| 8,466,036 B2 | 6/2013 | Brindle et al. |
| 8,481,405 B2 | 7/2013 | Arriagada et al. |
| 8,796,116 B2 | 8/2014 | Grabbe et al. |
| 8,846,493 B2 | 9/2014 | Libbert et al. |
| 8,859,393 B2 | 10/2014 | Ries et al. |
| 9,202,711 B2 | 12/2015 | Liu et al. |
| 9,496,239 B1 | 11/2016 | Edelsteain et al. |
| 2002/0090758 A1 | 7/2002 | Henley et al. |
| 2004/0005740 A1 | 1/2004 | Lochtefeld et al. |
| 2004/0031979 A1 | 2/2004 | Lochtefeld et al. |
| 2004/0108537 A1 | 6/2004 | Tiwari |
| 2005/0153524 A1 | 7/2005 | Maa et al. |
| 2005/0167002 A1 | 8/2005 | Ghyselen et al. |
| 2006/0030124 A1 | 2/2006 | Maa et al. |
| 2006/0033110 A1 | 2/2006 | Alam et al. |
| 2006/0226482 A1 | 10/2006 | Suvorov |
| 2007/0032040 A1 | 2/2007 | Lederer |
| 2007/0054466 A1 | 3/2007 | Hebras |
| 2009/0004833 A1 | 1/2009 | Suzuki et al. |
| 2009/0014828 A1 | 1/2009 | Mizushima et al. |
| 2009/0092810 A1 | 4/2009 | Lee et al. |
| 2009/0321829 A1 | 12/2009 | Nguyen et al. |
| 2011/0174362 A1 | 7/2011 | Tanner et al. |
| 2011/0298083 A1 | 12/2011 | Yoneda |
| 2012/0034758 A1 | 2/2012 | Koezuka |
| 2012/0091587 A1 | 4/2012 | Or-Bach et al. |
| 2012/0161310 A1 | 6/2012 | Brindle et al. |
| 2012/0190171 A1* | 7/2012 | Yamazaki ......... H01L 21/76254 438/455 |
| 2012/0238070 A1 | 9/2012 | Libbert et al. |
| 2012/0267681 A1 | 10/2012 | Nemoto et al. |
| 2013/0120951 A1 | 5/2013 | Zuo et al. |
| 2013/0122672 A1 | 5/2013 | Or-Bach et al. |
| 2013/0156989 A1 | 6/2013 | Moriceau et al. |
| 2013/0168835 A1 | 7/2013 | Botula et al. |
| 2013/0193445 A1 | 8/2013 | Dennard et al. |
| 2013/0294038 A1 | 11/2013 | Landru et al. |
| 2013/0344680 A1 | 12/2013 | Arriagada et al. |
| 2014/0042598 A1 | 2/2014 | Kitada et al. |
| 2014/0070215 A1 | 3/2014 | Bedell et al. |
| 2014/0084290 A1 | 3/2014 | Allibert et al. |
| 2014/0120654 A1 | 5/2014 | Fujii et al. |
| 2014/0124902 A1 | 5/2014 | Botula et al. |
| 2014/0273405 A1 | 9/2014 | Liu et al. |
| 2015/0004778 A1 | 1/2015 | Botula et al. |
| 2015/0115480 A1 | 4/2015 | Peidous et al. |

FOREIGN PATENT DOCUMENTS

| | | |
|---|---|---|
| EP | 2426701 A1 | 7/2012 |
| EP | 2608252 A1 | 6/2013 |
| JP | 2012253364 A | 12/2012 |
| WO | 2009120407 A2 | 10/2009 |
| WO | 2012127006 A1 | 9/2012 |
| WO | 2017087393 A1 | 5/2017 |

OTHER PUBLICATIONS

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.

Lederer, D. et al., Enhanced High resistivity SOI wafers for RF Applications, 2004, IEEE International SOI Conference, Oct. 2004, pp. 46-47.

Lederer D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE International SOI Conference Proceedings, 2006, pp. 29-30.

Kerr, Daniel C., Identification of RF harmonic distortion of Si substrates and its reduction using a trap-rich layer, IEEE (IEEE Topical Meeting), 2008, pp. 151-154.

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

Zamir, S. et al., Reduction of cracks in GaN films on Si-on-insulator by lateral confined epitaxy, Journal of Crystal Growth, Elsevier Amsterdam, NL, Sep. 2002, pp. 375-380, vol. 243, No. 3-4.

Gao, Min, et al., A transmission electron microscopy study of microstructural defects in proton implanted silicon, Journal of Applied Physics, Oct. 15, 1996 American Institute of Physcis, pp. 4767-4769, vol. 70, No. 8.

Gao, Min, et al., Two-dimensional network of dislocations and nanocavities in hydrogen-implanted and two-step annealed silicon, Applied Physcis Letters, American Institute of Physics May 18, 1998, pp. 2544-2546??vol. 72, No. 20.

\* cited by examiner

PECVD OXIDE + ANNEAL + CMP

PECVD OXIDE + CMP

THERMAL OXIDE + ANNEAL + CMP

THERMAL OXIDE + CMP

METHOD OF MANUFACTURE OF A SEMICONDUCTOR ON INSULATOR STRUCTURE

CROSS-REFERENCE TO RELATED APPLICATION

This application claims priority to U.S. Provisional Patent Application No. 62/532,417 filed on Jul. 14, 2017, the entire disclosure of which is hereby incorporated by reference in its entirety.

FIELD OF THE INVENTION

The present invention generally relates to the field of semiconductor wafer manufacture. More specifically, the present invention relates to a method of a manufacturing a semiconductor-on-insulator (e.g., silicon-on-insulator) structure.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, gallium arsenide, and other alloys of Group III and Group V elements, such as gallium nitride or indium phosphide, or alloys of Group II and Group VI elements, such as cadmium sulfide or zinc oxide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. Thick film device layers may have a device layer thickness between about 1.5 micrometers and about 20 micrometers. Thin film device layers may have a thickness between about 0.01 micrometer and about 0.20 micrometer. In general, composite layer structures, such as silicon-on-insulator (SOI), silicon-on-sapphire (SOS), and silicon-on-quartz, are produced by placing two wafers in intimate contact, thereby initiating bonding by van der Waal's forces, followed by a thermal treatment to strengthen the bond. The anneal may convert the terminal silanol groups to siloxane bonds between the two interfaces, thereby strengthening the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds or other contaminants, such as boron compounds, deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The surfaces of the wafers can be additionally chemically activated by a wet treatment, such as an SC1 clean or hydrofluoric acid. The wet treatment and the plasma activation may occur in either order, or the wafers may be subjected to only one treatment. The wafers are then pressed together, and a bond is formed there between. This bond is relatively weak, due to van der Waal's forces, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of cracks along the cleave plane, thus separating a portion of the donor wafer. The crack forms due to the formation of voids from the implanted ions, which grow by Ostwald ripening. The voids are filled with hydrogen and helium. The voids become platelets. The pressurized gases in the platelets propagate micro-cavities and micro-cracks, which weaken the silicon on the implant plane. If the anneal is stopped at the proper time, the weakened bonded wafer may be cleaved by a mechanical process. However, if the thermal treatment is continued for a longer duration and/or at a higher temperature, the micro-crack propagation reaches the level where all cracks merge along the cleave plane, thus separating a portion of the donor wafer. This method allows for better uniformity of the transferred layer and allows recycle of the donor wafer, but typically requires heating the implanted and bonded pair to temperatures approaching 500° C.

SUMMARY OF THE INVENTION

The present invention is directed to a method of preparing a multilayer structure, the method comprising: (a) forming a front handle silicon dioxide layer on a front handle surface of a single crystal silicon handle wafer and a back handle silicon dioxide layer on a back handle surface of a single crystal silicon handle wafer, wherein the single crystal silicon handle wafer comprises two major, generally parallel surfaces, one of which is the front handle surface of the single crystal silicon handle wafer and the other of which is the back handle surface of the single crystal silicon handle wafer, a circumferential edge joining the front handle surface and the back handle surface of the single crystal silicon handle wafer, a central plane between the front handle surface and the back handle surface of the single crystal silicon handle wafer, and a bulk region between the front and back handle surfaces of the single crystal silicon handle wafer; (b) forming a front handle silicon nitride layer on the front handle silicon dioxide layer and a back handle silicon nitride layer on the back handle silicon dioxide layer; (c) bonding the front handle silicon nitride layer to a donor silicon dioxide layer on a front donor surface of a single crystal silicon donor wafer to thereby form a bonded structure, wherein the single crystal silicon donor wafer comprises two major, generally parallel surfaces, one of which is the front donor surface of the single crystal silicon donor wafer and the other of which is the back donor surface of the single crystal silicon donor wafer, a circumferential edge joining the front donor surface and the back donor surface of the single crystal silicon donor wafer, a central plane between the front donor surface and the back donor surface of the single crystal silicon donor wafer, and a bulk region between the front and back donor surfaces of the single crystal silicon donor wafer, and further wherein the single crystal silicon donor wafer comprises a damage layer formed by ion implantation; (d) removing the back handle silicon nitride layer; and (e) removing the back handle silicon dioxide layer.

The present invention is further directed to a method of preparing a multilayer structure, the method comprising: (a) forming a front handle silicon dioxide layer on a front handle surface of a single crystal silicon handle wafer, wherein the single crystal silicon handle wafer comprises two major, generally parallel surfaces, one of which is the front handle surface of the single crystal silicon handle wafer and the other of which is the back handle surface of the single crystal silicon handle wafer, a circumferential edge joining the front handle surface and the back handle surface of the single crystal silicon handle wafer, a central plane between the front handle surface and the back handle surface of the single crystal silicon handle wafer, and a bulk region between the front and back handle surfaces of the single crystal silicon handle wafer; (b) forming a front handle silicon nitride layer on the front handle silicon dioxide layer; (c) annealing the single crystal silicon handle wafer comprising the front handle silicon dioxide layer and the front handle silicon nitride layer at a temperature and duration sufficient to densify the front handle silicon dioxide layer, the front handle silicon nitride layer, or both; and (d) bonding the front handle silicon nitride layer to a donor silicon dioxide layer on a front donor surface of a single crystal silicon donor wafer to thereby form a bonded structure, wherein the single crystal silicon donor wafer comprises two major, generally parallel surfaces, one of which is the front donor surface of the single crystal silicon donor wafer and the other of which is the back donor surface of the single crystal silicon donor wafer, a circumferential edge joining the front donor surface and the back donor surface of the single crystal silicon donor wafer, a central plane between the front donor surface and the back donor surface of the single crystal silicon donor wafer, and a bulk region between the front and back donor surfaces of the single crystal silicon donor wafer, and further wherein the single crystal silicon donor wafer comprises a damage layer formed by ion implantation.

The present invention is still further directed to a method of preparing a multilayer structure, the method comprising: (a) forming a front donor silicon dioxide layer on a front donor surface of a single crystal silicon donor wafer, wherein the single crystal silicon donor wafer comprises two major, generally parallel surfaces, one of which is the front donor surface of the single crystal silicon donor wafer and the other of which is the back donor surface of the single crystal silicon donor wafer, a circumferential edge joining the front donor surface and the back donor surface of the single crystal silicon donor wafer, a central plane between the front donor surface and the back donor surface of the single crystal silicon donor wafer, and a bulk region between the front and back donor surfaces of the single crystal silicon donor wafer; (b) forming a front donor silicon nitride layer on the front donor silicon dioxide layer; (c) implanting ions through the front donor silicon nitride layer and the front donor silicon dioxide layer and into the bulk region of the single crystal silicon donor wafer to thereby form a damage layer; and (d) bonding the front donor silicon nitride layer to a handle silicon dioxide layer on a front handle surface of a single crystal silicon handle wafer, wherein the single crystal silicon handle wafer comprises two major, generally parallel surfaces, one of which is the front handle surface of the single crystal silicon handle wafer and the other of which is the back handle surface of the single crystal silicon handle wafer, a circumferential edge joining the front handle surface and the back handle surface of the single crystal silicon handle wafer, a central plane between the front handle surface and the back handle surface of the single crystal silicon handle wafer, and a bulk region between the front and back handle surfaces of the single crystal silicon handle wafer.

Other objects and features will be in part apparent and in part pointed out hereinafter.

Figure 1A:
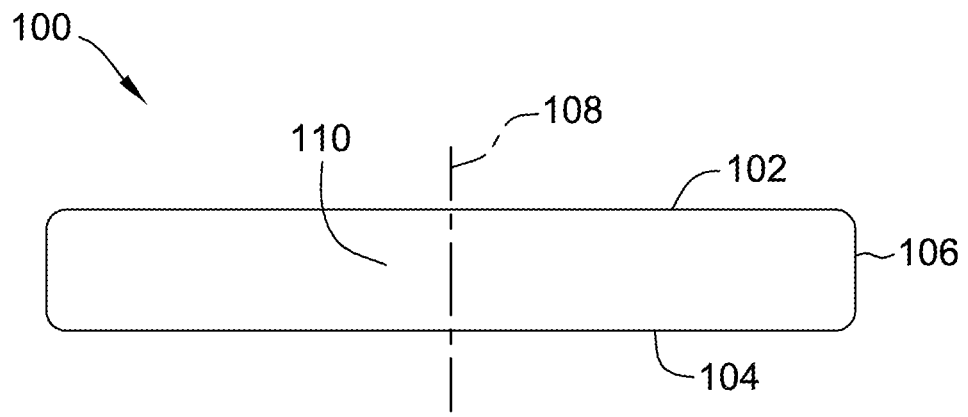
FIGS. 1A through 1C depict a process flow according to some embodiments of the present invention.
Figure 1B:
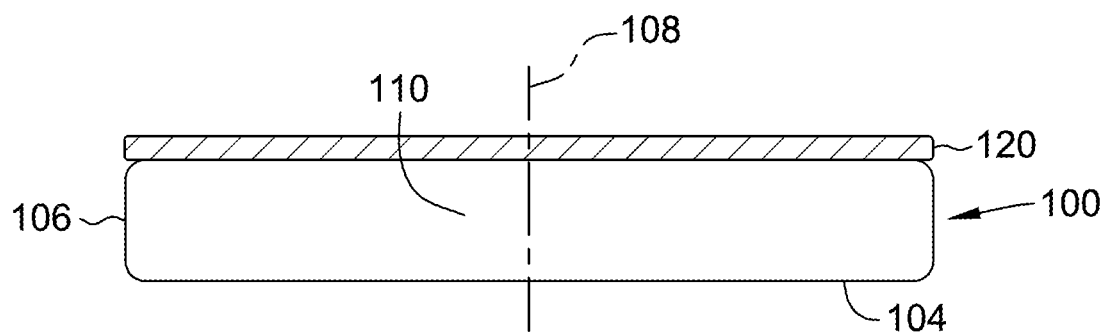
Figure 1C:
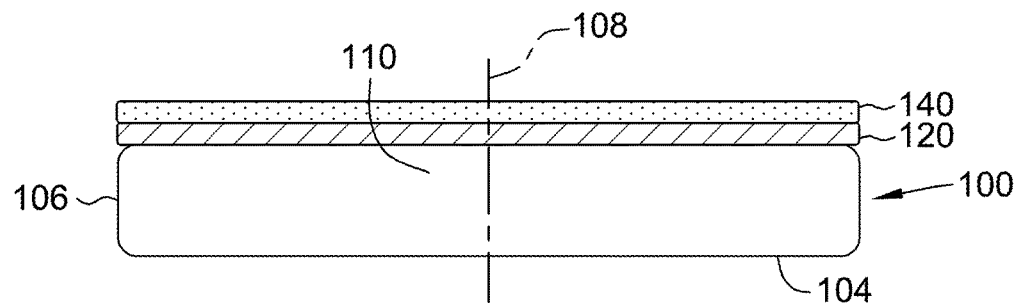

The figures illustrate non-limiting embodiments of the invention.

DETAILED DESCRIPTION OF THE EMBODIMENT(S) OF THE INVENTION

The present invention is directed to a method of manufacture of a multi-layered semiconductor-on-insulator structure (SOI, e.g., a silicon-on-insulator structure). The dielectric layer in the semiconductor-on-insulator structure may comprise one or more insulating layers located between the handle wafer and the donor wafer or device layer. The one or more insulating layers in the SOI structure according to the present invention may include silicon nitride, silicon dioxide, silicon oxynitride, and combinations of these materials. Preferably, the dielectric layer comprises a multilayer comprising at least two insulating layers comprising these materials, or at least three insulating layers, or more insulating layers. According to some embodiments of the present invention, the insulating layer may comprises an oxide-nitride-oxide (ONO) dielectric layer in which a first oxide layer is in interfacial contact with the handle wafer and a second oxide layer is in interfacial contact with the donor wafer or device layer. The nitride layer is between the two oxide layers.

SOI wafers comprising an ONO dielectric may be manufactured to have layers (e.g., oxide and/or nitride layers) on the backside of the handle wafer. The methods disclosed herein yield wafers at end-of-the-line which have no backside layers. According to some embodiments of the method of the present invention, the SOI structure may be manufactured to have a handle wafer with backside layers, which are later removed. According to embodiments of the method of the present invention, the SOI structure may be manufactured in a manner in which the handle wafer has no dielectric layers deposited on the backside. In such embodiments, backside layer removal is not necessary.

SOI wafers comprising an ONO dielectric are useful in the manufacture of radiofrequency devices. The nitride layer between the two oxide layers functions as an etch stop layer. After device fabrication on the top silicon layer, the fabricated device wafer is temporarily bonded to a support substrate and the handle wafer is removed. The nitride layer serves as the etch stop for the handle removal process. Then, the device layer is bonded to another substrate which enables device operation at lower harmonic distortion. Ideally, the backside of the handle wafer is free of nitride and oxide layers, which eases the handle removal process. Also, in the fabrication of the devices in the top silicon layer, there may be wafer processing operations where the wafer backside emissivity can alter the process control (e.g., temperature measurement). Over the course of manufacturing ONO SOI wafers, if the handle wafers comprise an oxide backside layer and/or nitride backside layer, or even a single oxide backside layer, process variation could lead to variability in layer thickness(es) which may alter emissivity and lead to lot-to-lot process variability; or even within-wafer local variation. Thus, it is desirable to have a manufacturing process where backside layers are either not produced or are eliminated in the manufacturing process.

I. Semiconductor Handle Wafer and Semiconductor Donor Wafer

The wafers for use in the present invention include a semiconductor handle wafer, e.g., a single crystal semiconductor handle wafer, and a semiconductor donor wafer, e.g., a single crystal semiconductor donor wafer. The semiconductor device layer in a semiconductor-on-insulator composite structure is derived from the single crystal semiconductor donor wafer. The semiconductor device layer may be transferred onto the semiconductor handle wafer by wafer thinning techniques such as etching a semiconductor donor wafer or by cleaving a semiconductor donor wafer comprising a damage plane. According to the method of the present invention, one or more insulating layers may be prepared on the surfaces of either or both the single crystal semiconductor handle wafer and the single crystal semiconductor donor wafer.

With reference to FIG. 1A, an exemplary, non-limiting single crystal semiconductor handle wafer 100 is depicted. A single crystal semiconductor donor wafer may have substantially the same initial structure. In general, the single crystal semiconductor handle wafer 100 comprises two major, generally parallel surfaces. One of the parallel surfaces is a front surface 102 of the single crystal semiconductor handle wafer 100, and the other parallel surface is a back surface 104 of the single crystal semiconductor handle wafer 100. The single crystal semiconductor handle wafer 100 comprises a circumferential edge 106 joining the front and back surfaces 102, 104. The single crystal semiconductor handle wafer 100 comprise a central axis 108 perpendicular to the two major, generally parallel surfaces 102, 104 and also perpendicular to a central plane defined by the points midway between the front and back surfaces 102, 104. The single crystal semiconductor handle wafer 100 comprises a bulk region 110 between the two major, generally parallel surfaces 102, 104. Since semiconductor wafers, e.g., silicon wafers, typically have some total thickness variation (TTV), warp, and bow, the midpoint between every point on the front surface 102 and every point on the back surface 104 may not precisely fall within a plane. As a practical matter, however, the TTV, warp, and bow are typically so slight that to a close approximation the midpoints can be said to fall within an imaginary central plane which is approximately equidistant between the front and back surfaces 102, 104.

Prior to any operation as described herein, the front surface 102 and the back surface 104 of the single crystal semiconductor handle wafer 100 may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle wafer 100, e.g., a single crystal silicon handle wafer, refers to the major surface of the wafer that becomes an interior surface of the bonded structure. Accordingly, a "back surface" of a single crystal semiconductor handle wafer 100, e.g., a handle wafer, refers to the major surface that becomes an exterior surface of the bonded structure. Similarly, a "front surface" of a single crystal semiconductor donor wafer, e.g., a single crystal silicon donor wafer, refers to the major surface of the single crystal semiconductor donor wafer that becomes an interior surface of the bonded structure, and a "back surface" of a single crystal semiconductor donor wafer, e.g., a single crystal silicon donor wafer, refers to the major surface that becomes an exterior surface of the bonded structure. In the context of the present invention, one or more insulating layers may be prepared on the front surfaces of either or both the single crystal semiconductor handle wafer 100 and the single crystal semiconductor donor wafer. Certain deposition techniques deposit insulating layers on the front surface and the back surface of the handle wafer and/or donor wafer. Such techniques envelope the wafer with the insulating layer material. Upon completion of conventional bonding and wafer thinning steps, the single crystal semiconductor donor wafer forms the semiconductor device layer of the semiconductor-on-insulator (e.g., silicon-on-insulator) composite structure.

The single crystal semiconductor handle wafer and the single crystal semiconductor donor wafer may be single crystal semiconductor wafers. In preferred embodiments, the semiconductor wafers comprise a material selected from the group consisting of silicon, silicon carbide, silicon germanium, gallium arsenide, gallium nitride, indium phosphide, indium gallium arsenide, germanium, and combinations thereof. The single crystal semiconductor wafers, e.g., the single crystal silicon handle wafer and single crystal silicon donor wafer, of the present invention typically have a nominal diameter of at least about 150 mm, at least about 200 mm, at least about 300 mm, or at least about 450 mm. Wafer thicknesses may vary from between about 100 micrometers and about 5000 micrometers, such as between about 100 micrometers and about 1500 micrometers, such as between about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. In some embodiments, the wafer thickness may be about 775 micrometers.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, *Semiconductor Silicon Crystal Technology*, Academic Press, 1989, and *Silicon Chemical Etching*, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications. If desired, the wafers can be cleaned, for example, in a standard SC1 (5 parts water:1 part aqueous ammonium hydroxide (29% by weight):1 part aqueous hydrogen peroxide (30% by weight))/SC2 solution (6 parts water:1 part aqueous hydrochloric acid (37% by weight):1 part aqueous hydrogen peroxide (30% by weight)). In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be between about 725 micrometers and about 800 micrometers, such as between about 750 micrometers and about 800 micrometers. In some embodiments, the wafer thickness may be about 725 micrometers. In some embodiments, the wafer thickness may be about 775 micrometers.

In some embodiments, the single crystal semiconductor wafers, i.e., single crystal semiconductor handle wafer and single crystal semiconductor donor wafer, comprise interstitial oxygen in concentrations that are generally achieved by the Czochralski-growth method. In some embodiments, the single crystal semiconductor wafers comprise oxygen in a concentration between about 4 PPMA and about 18 PPMA. In some embodiments, the semiconductor wafers comprise oxygen in a concentration between about 10 PPMA and about 35 PPMA. In some embodiments, the single crystal silicon wafer comprises oxygen in a concentration of no greater than about 10 PPMA. Interstitial oxygen may be measured according to SEMI MF 1188-1105.

The single crystal semiconductor handle wafer 100 may have any resistivity obtainable by the Czochralski or float zone methods. Accordingly, the resistivity of the single crystal semiconductor handle wafer 100 is based on the requirements of the end use/application of the structure of the present invention. The resistivity may therefore vary from milliohm or less to megaohm or more. In some embodiments, the single crystal semiconductor handle wafer 100 comprises a p-type or an n-type dopant. Suitable dopants include boron (p type), gallium (p type), aluminum (p type), indium (p type), phosphorus (n type), antimony (n type), and arsenic (n type). The dopant concentration is selected based on the desired resistivity of the handle wafer. In some embodiments, the single crystal semiconductor handle wafer comprises a p-type dopant. In some embodiments, the single crystal semiconductor handle wafer is a single crystal silicon wafer comprising a p-type dopant, such as boron.

In some embodiments, the single crystal semiconductor handle wafer 100 has a relatively low minimum bulk resistivity, such as below about 100 ohm-cm, below about 50 ohm-cm, below about 1 ohm-cm, below about 0.1 ohm-cm, or even below about 0.01 ohm-cm. In some embodiments, the single crystal semiconductor handle wafer 100 has a relatively low minimum bulk resistivity, such as below about 100 ohm-cm, or between about 1 ohm-cm and about 100 ohm-cm. Low resistivity wafers may comprise electrically active dopants, such as boron (p type), gallium (p type), aluminum (p type), indium (p type), phosphorus (n type), antimony (n type), and arsenic (n type).

In some embodiments, the single crystal semiconductor handle wafer 100 has a relatively high minimum bulk resistivity. High resistivity wafers are generally sliced from single crystal ingots grown by the Czochralski method or float zone method. High resistivity wafers may comprise electrically active dopants, such as boron (p type), gallium (p type), aluminum (p type), indium (p type), phosphorus (n type), antimony (n type), and arsenic (n type), in generally very low concentrations. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 100 Ohm-cm, or even at least about 500 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 1000 Ohm-cm and about 6000 ohm-cm, between about 2000 Ohm-cm and about 10,000 Ohm-cm, between about 3000 Ohm-cm and about 10,000 Ohm-cm, or between about 3000 Ohm-cm and about 5,000 Ohm-cm. In some preferred embodiments, the single crystal semiconductor handle wafer has a bulk resistivity between about 1000 Ohm-cm and about 6,000 Ohm-cm. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

The single crystal semiconductor handle wafer 100 may comprise single crystal silicon. The single crystal semiconductor handle wafer 100 may have, for example, any of (100), (110), or (111) crystal orientation, and the choice of crystal orientation may be dictated by the end use of the structure.

II. Dielectric Layer Comprising One or More Insulating Layers

Figure 2:
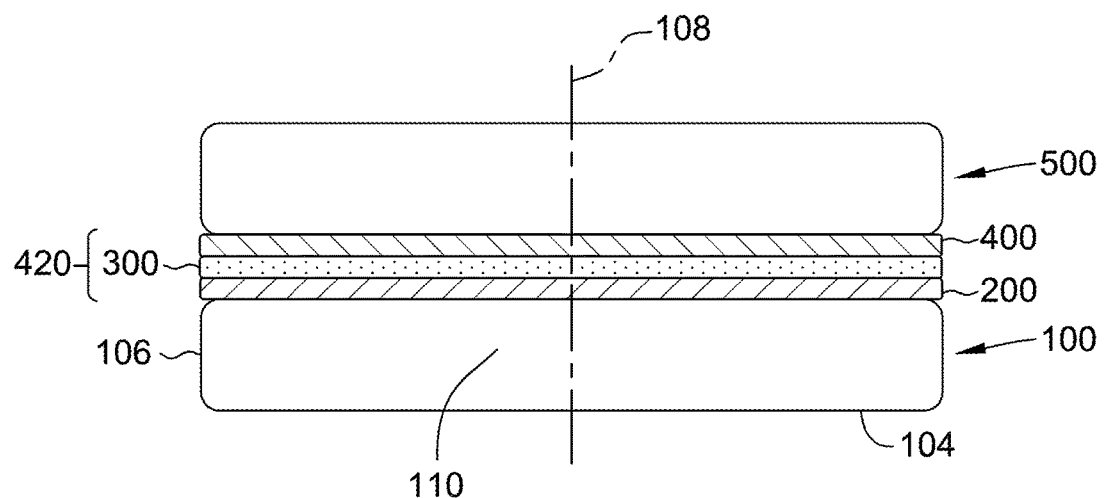
FIG. 2 depicts a multilayer structure according to some embodiments of the present invention.

With reference to FIG. 2, a non-limiting, exemplary multi-layered semiconductor-on-insulator structure (SOI, e.g., a silicon-on-insulator structure) is depicted. According to the method of the present invention, a dielectric layer 420 comprising one or more insulating layers (e.g., three or more insulating layers, therein numbers 200, 300, and 400) is prepared between a single crystal semiconductor handle wafer 100 and a single crystal semiconductor donor wafer 500. According to FIG. 2, the SOI structure comprises a dielectric layer 420 comprising three insulating layers, e.g., an oxide-nitride-oxide dielectric layer (ONO), according to some embodiments of the present invention. In some embodiments, the multi-layered semiconductor-on-insulator structure comprises a single crystal semiconductor handle wafer 100, a first semiconductor oxide layer 200, a semiconductor nitride layer 300, a second semiconductor oxide layer 400, and a single crystal semiconductor donor wafer 500. Other configurations of insulating layers fall within the scope of the present disclosure. For example, one or more insulating layers may be excluded from the dielectric layer, or additional insulating layers may be included. With reference to FIG. 2, the bonding interface can be any of the following: (1) between the single crystal semiconductor handle wafer 100 and the first semiconductor oxide layer 200, (2) between the first semiconductor oxide layer 200 and the semiconductor nitride layer 300, (3) between the semiconductor nitride layer 300 and the semiconductor second oxide layer 400, (4) between the first semiconductor oxide layer 200 and the second semiconductor oxide layer 400 if the structure lacks a nitride layer, and (5) between the second semiconductor oxide layer 400 and the single crystal semiconductor donor wafer 500.

The dielectric layer 420 may comprise the ONO layers as depicted in FIG. 2, or may comprise other structures comprising one or more layers of insulating material. The dielectric layer 420 may be formed upon the front surface of the single crystal semiconductor handle wafer 100 or it may be formed upon the front surface of the single crystal semiconductor donor wafer 500. In still further embodiments, portions of the dielectric layer 420 may be contributed by insulating layers formed upon both the front surface of the single crystal semiconductor handle wafer 100 and the front surface of the single crystal semiconductor donor wafer 500.

The dielectric layer according to the present invention may comprise insulating materials selected from among silicon dioxide, silicon nitride, silicon oxynitride, and any combination thereof. In some embodiments, the dielectric layer comprises one or more insulating material selected from the group consisting of silicon dioxide, silicon nitride, silicon oxynitride, and any combination thereof. In some embodiments, the dielectric layer has a thickness of at least about 10 nanometer thick, such as between about 10 nanometers and about 10,000 nanometers, between about 10 nanometers and about 5,000 nanometers, between 50 nanometers and about 500 nanometers, or between about 100 nanometers and about 400 nanometers, such as about 50 nanometers, about 75 nanometers, about 85 nanometers, about 100 nanometers, about 150 nanometers, about 175 nanometers, or about 200 nanometers.

In some embodiments, the dielectric layer 420 comprises multiple layers of insulating material, for example, as depicted in FIG. 2, although other configurations are within the scope of this invention. The dielectric layer may comprise two insulating layers, three insulating layers, or more. In some embodiments, each insulating layer may comprise a material selected from the group consisting of silicon dioxide, silicon nitride, silicon oxynitride, and any combination thereof. Each insulating layer may have a thickness of at least about 1 nanometer thick, or at least about 10 nanometer thick, such as between about 10 nanometers and about 10,000 nanometers, between about 10 nanometers and about 5,000 nanometers, between 50 nanometers and about 500 nanometers, or between about 100 nanometers and about 400 nanometers, such as about 50 nanometers, about 75 nanometers, about 85 nanometers, about 100 nanometers, about 150 nanometers, about 175 nanometers, or about 200 nanometers.

In some embodiments, the dielectric layer comprises two insulating layers, wherein the two insulating layers comprise silicon dioxide layer, silicon nitride, silicon oxynitride, or any combination thereof. In some embodiments, the dielectric layer comprises two insulating layers prepared upon the front surface of a single crystal semiconductor donor wafer. For example, the two layers comprise a silicon dioxide layer in interfacial contact with the front surface of the single crystal semiconductor donor wafer (before the cleaving process) or the single crystal semiconductor device layer (after the cleaving process) and a silicon nitride layer in interfacial contact with the silicon dioxide layer. In some embodiments, the dielectric layer comprises two insulating layers prepared upon the front surface of a single crystal semiconductor handle wafer. In some embodiments, the dielectric layer comprises two insulating layers, one of which is prepared upon the front surface of a single crystal semiconductor handle wafer, and the other of which is prepared upon the front surface of a single crystal semiconductor donor wafer. Each insulating layer within a bilayer dielectric layer may have a thickness of at least about 1 nanometer thick, or at least about 10 nanometer thick, such as between about 10 nanometers and about 10,000 nanometers, between about 10 nanometers and about 5,000 nanometers, between 50 nanometers and about 500 nanometers, or between about 100 nanometers and about 400 nanometers, such as about 50 nanometers, about 75 nanometers, about 85 nanometers, about 100 nanometers, about 150 nanometers, about 175 nanometers, or about 200 nanometers.

In some embodiments, and as depicted in FIG. 2, the dielectric layer 420 comprises three insulating layers. In some embodiments, the three insulating layers comprise a silicon dioxide layer, a silicon nitride layer in interfacial contact with the silicon dioxide layer, and a silicon dioxide layer in interfacial contact with the silicon nitride layer. In some embodiments, the dielectric layer comprises three insulating layers prepared upon the front surface of a single crystal semiconductor donor wafer. For example, the dielectric layer 420 comprises three insulating layers, wherein the three insulating layers comprise a silicon dioxide layer in interfacial contact with the front surface of the single crystal semiconductor donor wafer (before the cleaving process) or the single crystal semiconductor device layer (after the cleaving process), a silicon nitride layer in interfacial contact with the silicon dioxide layer, and a silicon dioxide layer in interfacial contact with the silicon nitride layer. In some embodiments, the dielectric layer comprises three insulating layers prepared upon the front surface of a single crystal semiconductor handle wafer. In some embodiments, the dielectric layer comprises three insulating layers, one or two of which are prepared upon the front surface of a single crystal semiconductor handle wafer, and the other one or two of which are prepared upon the front surface of a single crystal semiconductor donor wafer. Each insulating layer within a trilayer dielectric layer may have a thickness of at least about 1 nanometer thick, or at least about 10 nanometer thick, such as between about 10 nanometers and about 10,000 nanometers, between about 10 nanometers and about 5,000 nanometers, between 50 nanometers and about 500 nanometers, or between about 100 nanometers and about 400 nanometers, such as about 50 nanometers, about 75 nanometers, about 85 nanometers, about 100 nanometers, about 150 nanometers, about 175 nanometers, or about 200 nanometers.

III. Thermal Deposition of Insulating Layers

In some embodiments, one or more insulating layers may be prepared upon the front surface of the single crystal semiconductor handle wafer 100 and/or one or more insulating layers may be prepared upon the front surface of a single crystal semiconductor donor wafer by a thermal deposition process. In general, a thermal oxidation method oxidizes both the front surface 102 and the back surface 104 of a single crystal semiconductor handle wafer 100 or single crystal semiconductor donor wafer, unless a masking technique is employed to inhibit oxidation of a side, or a portion of a side, of a wafer. In some embodiments, oxidation of both the front side and the back side of a wafer is advantageous to offset compressive stresses that may otherwise result in wafer bow for a wafer having an oxidation layer on only one side of the wafer. In some embodiments, a blanket nitridation method may be used to deposit silicon nitride over a thermally deposited silicon dioxide layer. Accordingly, in some embodiments, the single crystal semiconductor handle wafer 100 comprises a silicon dioxide layer that envelopes the wafer and a silicon nitride layer in contact with the silicon dioxide layer that envelopes the silicon dioxide layer. In later steps, according to the method of the present invention, one or more of the backside nitride and oxide layers may be removed.

In some embodiments, the front and back surfaces of the wafers may be thermally oxidized in a furnace such as an ASM A400 or ASM A400XT. Thermal oxidation generally occurs at elevated temperatures, such as between about 800° C. and about 1200° C. Oxidation may be wet (e.g., in a water vapor, such as ultrahigh purity steam for oxidation, ambient atmosphere) or dry (e.g., in an oxygen gas atmosphere). Optionally, the ambient atmosphere may contain hydrochloric acid, e.g., up to about 10 volume %, to remove surface impurities during oxidation. The oxidation layer, silicon dioxide $SiO_2$, on the front surface 102, the back surface 104, or both of the single crystal semiconductor handle wafer 100 or single crystal semiconductor donor wafer may be at least about 1 nanometer thick, or at least about 10 nanometers thick, such as between about 10 nanometers and about 10,000 nanometers, between about 10 nanometers and about 5,000 nanometers, between 50 nanometers and about 500 nanometers, or between about 100 nanometers and about 400 nanometers, such as about 50 nanometers, about 75 nanometers, about 85 nanometers, about 100 nanometers, about 150 nanometers, about 175 nanometers, or about 200 nanometers. In thermal oxidation methods in which both the front and back surfaces are oxidized, the silicon dioxide layers are generally the same thicknesses front and back, although techniques may be used, such as etching or polishing, to vary the thicknesses.

In some embodiments, the oxidation layer is relatively thin, such as between about 5 angstroms and about 25 angstroms, such as between about 10 angstroms and about 15 angstroms. Thin oxide layers can be obtained on both sides of a semiconductor wafer by exposure to a standard cleaning solution, such as an SC1/SC2 cleaning solution. In some embodiments, the SC1 solution comprises 5 parts deioinized water, 1 part aqueous $NH_4OH$ (ammonium hydroxide, 29% by weight. of $NH_3$), and part of aqueous $H_2O_2$ (hydrogen peroxide, 30%). In some embodiments, the handle wafer may be oxidized by exposure to an aqueous solution comprising an oxidizing agent, such as an SC2 solution. In some embodiments, the SC2 solution comprises 5 parts deionized water, 1 part aqueous HCl (hydrochloric acid, 39% by weight), and 1 part of aqueous $H_2O_2$ (hydrogen peroxide, 30%).

In some embodiments, a nitride layer may be deposited over the front side, the back side, or both of a single crystal semiconductor handle wafer and/or single crystal semiconductor donor wafer. The nitride layer is generally deposited over an oxidation layer in the fabrication of ONO layers. Although masking techniques are available to deposit nitride layers on one side of a wafer, in some embodiments, nitridation of both the front side and the back side of a wafer is advantageous to offset tensile stresses that may otherwise result in wafer bow for a wafer having a nitride layer on only one side of the wafer. Thermal nitridation generally occurs at elevated temperatures, such above about 1200° C. Suitable nitridation atmospheres include nitrogen and ammonia. The nitridation layer, silicon nitride $Si_3N_4$, on the front surface 102, the back surface 104, or both of the single crystal semiconductor handle wafer 100 or single crystal semiconductor donor wafer may be at least about 1 nanometer thick, or at least about 10 nanometers thick, such as between about 10 nanometers and about 10,000 nanometers, between about 10 nanometers and about 5,000 nanometers, between 50 nanometers and about 500 nanometers, or between about 100 nanometers and about 400 nanometers, such as about 50 nanometers, about 75 nanometers, about 85 nanometers, about 100 nanometers, about 150 nanometers, about 175 nanometers, or about 200 nanometers. In thermal nitridation methods in which both the front and back surfaces are nitirded, the silicon nitride layers are generally the same thicknesses front and back, although techniques may be used, such as etching or polishing, to vary the thicknesses.

IV. Chemical Vapor Deposition of Insulating Layers

In some embodiments, one or more insulating layers may be prepared upon the front surface, the back surface, or both the front and back surfaces of the single crystal semiconductor handle wafer 100 or upon the front surface, the back surface, of both the front and back surfaces of a single crystal semiconductor donor wafer by a chemical vapor deposition process, such as plasma enhanced chemical vapor deposition or low pressure chemical vapor deposition. In some embodiments, an insulating layer comprising a semiconductor oxide (e.g., silicon dioxide) is deposited by an oxygen chemical vapor deposition treatment. In some embodiments, an insulating layer comprising a semiconductor nitride (e.g., silicon nitride) is deposited by a nitrogen chemical vapor deposition treatment. In some embodiments, an insulating layer comprising a semiconductor oxynitride (e.g., silicon oxynitride) is deposited by a chemical vapor deposition treatment comprising nitrogen and oxygen precursors. A wide variety of wafer configurations may be subjected to oxygen chemical vapor deposition treatment and/or nitrogen chemical vapor deposition treatment. For example, plasma enhanced chemical vapor deposition enables the plasma oxidation or nitridation of a single side, preferably the front side, of the single crystal semiconductor handle wafer and/or single crystal semiconductor donor wafer. Low pressure chemical vapor deposition is generally a blanket deposition technique, which plasma oxidizes and/or nitrides both surfaces of a wafer. One or more insulating layers may be deposited by chemical vapor deposition on the front surface 102 of the single crystal semiconductor handle wafer 100. In still further embodiments of the present invention, one or more insulating layers may be deposited upon the single crystal semiconductor donor wafer by chemical vapor deposition. Deposition on a single side of the wafer enables the elimination of a later backside oxide or backside nitride layer removal step.

In some embodiments, single sided deposition may be achieved by plasma enhanced chemical vapor deposition. The oxygen plasma and/or nitrogen plasma surface activation tool is a commercially available tool, such as those available from EV Group, such as EVG®810LT Low Temp Plasma Activation System. General requirements of a plasma enhanced CVD chamber include a reactor with various electrode designs, power generation electronics, impedance matching network to transfer power to the gas load, mass flow controllers for input gases, and pressure control systems. Typical systems are vertical tube reactors powered by an inductively coupled RF source. The single crystal semiconductor handle wafer 100 and/or donor wafer is loaded into the chamber and placed on a heated support chamber. The chamber is evacuated and backfilled with an oxygen gas source and/or a nitrogen gas source in a carrier gas, such as argon, to a pressure less than atmospheric to thereby create the plasma. Oxygen and/or water are suitable source gases for plasma oxide treatment. Ammonia and/or nitrogen and/or nitric oxide (NO) and/or nitrous oxide ($N_2O$) gas are suitable source gases for plasma nitride treatment. Oxynitride films may be deposited by including oxygen and nitrogen gas sources. Additionally, the use of nitric oxide or nitrous oxide additionally incorporates oxygen in to the insulating layer, thereby depositing an oxynitride film. To deposit a silicon nitride or a silicon dioxide plasma film, suitable silicon precursors include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), tetra-ethyl orthosilicate ($Si(OCH_2CH_3)_4$), among others. The flow rate ratios of the gaseous silicon precursor and the gaseous oxygen and/or nitrogen precursor may be between about 1/200 and about 1/50, such as about 1/100.

In some embodiments, a layer deposited with silane and nitrous oxide produces a less-conformal layer with less variability in the film stress with deposition conditions (temperature and frequency); while TEOS-based oxides are more conformal, have a higher variation in film stress with deposition conditions. In general, an oxide film exhibits compressive stress, but an oxide film exhibits tensile stress for some TEOS-based processes. In some embodiments, PECVD nitride deposition is done using silane (or DCS) and ammonia ($NH_3$). Film stress can be tuned with process conditions (temperature and plasma frequency). In general, a nitride film exhibits tensile stress. It should be noted that depending on oxide and nitride deposition process the overall wafer stress can be balanced, since oxide is compressive and nitride is tensile. It is desirable to balance the stresses for a handle wafer, so that the wafer warp (bow) is not excessive. Severely-high warp may lead to issues in bonding, layer transfer, post SOI wafer manufacturing processing or the customer's fab.

Suitably, Ar is added as a carrier gas. Plasma deposition may occur at a temperature between about 20° C. and about 400° C. Insulating layers may be at least about 1 nanometer thick, or at least about 10 nanometers thick, such as between about 10 nanometers and about 10,000 nanometers, between about 10 nanometers and about 5,000 nanometers, between 50 nanometers and about 500 nanometers, or between about 100 nanometers and about 400 nanometers, such as about 50 nanometers, about 75 nanometers, about 85 nanometers, about 100 nanometers, about 150 nanometers, about 175 nanometers, or about 200 nanometers. Deposition rates achievable by PECVD may be between about 100 angstroms/minute and about 1000 angstroms/minute.

In some embodiments, the PECVD deposition, particularly of silicon nitride layers, may be enhanced by microwave excitation. Microwave excited PECVD is advantageous since the discharge region can be separated from the reaction region, which results in a lower damage deposited layer. Precursor compounds, e.g., silane, oxygen, and ammonia, are excited by a microwave discharge, e.g., in a 2.45 GHz microwave, and the excited gases diffuse from the plasma chamber to the reaction chamber. Such films may be tuned to be at or near stoichiometry, e.g., $Si_3N_4$.

Plasma deposition may be varied to tune the properties of the semiconductor oxide (e.g., silicon dioxide), semiconductor nitride (e.g., silicon nitride), or semiconductor oxynitride (e.g., silicon oxynitride). For example, the pressure, flow rate, temperature, and relative ratio of precursors, e.g., ratio of $NH_3$ to $N_2O$ gases, may tune the silicon and nitride molar ratios of the plasma deposited nitride layer. Additionally, inclusion of an oxygen precursor incorporates oxygen to prepare an oxynitride layer. In some embodiments, plasma deposition may occur in an ambient atmosphere comprising silicon and nitrogen precursors to thereby deposit a silicon nitride layer on the handle wafer and/or donor wafer. After a duration sufficient to deposit nitride, an oxygen precursor may be introduced into the atmosphere to thereby deposit oxynitride. The oxygen concentration in the handle semiconductor oxynitride layer may vary according to a gradient, whereby the oxygen concentration is low at the interface with the handle semiconductor nitride layer and increases in the perpendicular direction away from the surface of the handle semiconductor oxynitride layer. After a duration sufficient to deposit an oxynitride layer, the flow of the nitrogen precursor may be ceased and deposition may continue only with silicon precursor and an oxygen gas source to thereby deposit an insulating layer comprising semiconductor oxide, e.g., silicon dioxide. In some embodiments, a dielectric layer may be deposited by plasma techniques comprising a semiconductor nitride (e.g., silicon nitride) layer and a semiconductor oxynitride (e.g., silicon oxynitride) layer. In some embodiments, a dielectric layer may be deposited by plasma techniques comprising a semiconductor nitride (e.g., silicon nitride) layer, a semiconductor oxynitride (e.g., silicon oxynitride) layer, and a semiconductor oxide (e.g., silicon dioxide) layer. Advantageously, plasma deposition of a dielectric layer comprising multiple insulating layers may occur continuously, i.e., without interruption, by varying the ratios and identities of the process gases.

In some embodiments, double sided deposition may be achieved by low pressure chemical vapor deposition. The LPCVD process can be done in a cold or hot walled quartz tube reactor. Hot walled furnaces allow batch processing and therefore high throughput. They also provide good thermal uniformity, and thus result in uniform films. A disadvantage of hot wall systems is that deposition also occurs on the furnace walls, so that frequent cleaning or replacement of the tube is necessary to avoid flaking of the deposited material and subsequent particle contamination. Cold wall reactors are lower maintenance, as there is no film deposition on the reactor walls. The low pressure chemical vapor semiconductor nitride (e.g., silicon nitride), semiconductor oxynitride (e.g., silicon oxynitride), or semiconductor oxide (e.g., silicon dioxide) may be formed at pressures between about 0.01 Torr and about 100 Torr, such as between about 0.1 Torr and about 1 Torr in a low pressure chemical vapor deposition. Temperatures may range between 425° C. and 900° C. Suitable precursors include those listed for PECVD. That is, LPCVD may be useful for the blanket deposition of silicon dioxide layers, silicon nitride layers, and silicon oxynitride layers, on the front and back surfaces of a handle wafer and/or a donor wafer.

The refractive index of the insulating layers may be tuned in the range between about 1.2 and about 3, such as between about 1.4 and about 2, or between about 1.5 and about 2. Post processing anneal and chemical vapor deposition of silicon dioxide, $SiO_2$, is possible to further tune the bond interface or hydrogen content of the film. The bonding between the handle wafer and the donor wafer benefits from roughness of less than about 5 angstroms, according to the root mean square method over a 2 micrometer by 2 micrometer surface area, RMS $_{2\times2\ um2}$. Generally this can be achieved in a plasma deposition with controlled inductively coupled plasma and lowering the bias power below the roughening threshold. Successful layer transfer has been demonstrated on plasma deposited films with roughness of about 5 angstroms or less.

Silicon oxynitride comprises a material having a composition that has a chemical formula $Si_xO_yN_z$. In its amorphous form, the values of x, y, and z may vary continuously between $SiO_2$ (silicon dioxide) and $Si_3N_4$ (silicon nitride). Accordingly, in a silicon oxynitride layer, the values of y and z are both greater than 0. A known crystalline form of silicon oxynitride is $Si_2ON_2$. According to some embodiments, the silicon oxynitride may be deposited in a gradient fashion, such that the composition of the film and thus the refractive index of the film may vary in a gradient fashion. In some embodiments, silicon oxynitride may be deposited upon a silicon nitride film by the gradual introduction of an oxygen precursor (e.g., oxygen, water, $N_2O$) into the deposition ambient atmosphere, which may comprise a silicon precursor and a nitrogen precursor, e.g., ammonia. The ratio of $NH_3:N_2O$ may be varied, that is, lowered, during deposition to gradually increase the oxygen content in the silicon oxynitride layer. In some embodiments, after deposition of a gradient silicon oxynitride layer, all nitrogen precursors are eliminated from the deposition atmosphere, and the atmosphere contains silicon precursors and oxygen precursors, which enables deposition of a silicon dioxide layer on the silicon oxynitride layer. According to some embodiments, the refractive index range of the silicon oxynitride film may vary between 2.0 for silicon nitride and 1.45 for silicon dioxide.

Silicon nitride produced from PECVD is structurally distinct from silicon nitride deposited according to conventional chemical or physical vapor deposition techniques. Conventional CVD or PVD deposition generally results in a silicon nitride layer having a stoichiometry of $Si_3N_4$. Plasma processes can be controlled to deposit a film having a composition such as $Si_xN_yH_z$ depending on the ratios of input reactant gases, power level, wafer temperature, and overall reactor pressure. Pathways in a plasma system exist to form Si—N, Si=N and Si≡N bonds. This is due to the fact that plasma energies are a hammer that produce $Si_xH_z$ and $N_yH_z$ species. For example, the refractive index and optical gap change dramatically with the Si/N ratio. At higher silane concentrations, the films become Si rich and may reach an index of refraction up to 3.0 (compared to 2 for LPCVD). Other properties that may be influenced include dielectric constant, breakdown, mechanical, and chemical (etch rate).

V. Densification Anneal

The handle wafer and/or donor wafer comprising one or more oxide and nitride layers may be subjected to a densification anneal. A densification anneal may occur for a duration between about 10 minutes and about 10 hours, such as between about 30 minutes and about 6 hours, or between about 1 hour and about 4 hours, such as about 4 hours. The ambient atmosphere of the densification anneal is preferably inert, such as a nitrogen or argon atmosphere. The temperature of the densification anneal may be at least about 900° C., such as between about 900° C. and about 1100° C., or between about 1000° C. about 1100° C. Advantageously, densified thermal or CVD oxide has lower stress than as-deposited oxide. Further, the densification anneal reduces the surface roughness of the dielectric layer.

In some embodiments, a densification anneal may reduce the layer thickness of a nitride layer by as much as about 20%, such as 15%, or about 14%, or about 13%. In some specific embodiments, the densification anneal may reduce the layer thickness of a nitride layer by between about 13.4% to about 13.8%. The thickness reduction is calculated according to the equation: 100× [(mean nitride thickness after anneal–mean nitride thickness before anneal)/(mean nitride thickness before anneal)]. In some embodiments, a densification anneal may reduce the layer thickness of an oxide layer by as much as about 2%, or about 1%. These changes in layer thicknesses apply to both PECVD nitride over thermal oxide and PECVD nitride over PECVD oxide). The warp of the handle wafer may increase with the densification anneal. In some specific embodiments in which the handle wafer comprises a PECVD nitride layer over a PECVD oxide layer, the increase in wafer bow may be as much as about 25 micrometers, such as about 20 micrometers. In some specific embodiments in which the handle wafer comprises a PECVD nitride layer over a thermal oxide layer, the increase in wafer bow may be as much as 40 micrometers, such as about 30 micrometers. However, densification induced wafer bow or warp may decrease as a result of nitride layer thinning in the subsequent CMP step. The warp (or bow) increases because the film is being densified and so the stress from this layer is increasing. With PECVD oxide the stress is compressive, while for PECVD nitride it is tensile; hence the case of PECVD nitride over PECVD oxide, the oxide and nitride densification partially cancel resulting in a lower delta warp.

VI. Smoothing Processes

The bond between the donor wafer and the handle wafer is strengthened when the bonding surfaces are smooth and has low defect density. A smooth surface enables the bond to survive the mechanical cleaving step. Even in embodiments wherein the wafer is subjected to densification anneal, the strength of the bond is directly related to the smoothness of the bond surfaces. In general, the surface roughness of bare silicon is sufficiently smooth to yield a sufficiently strong bond. Wafers comprising one or more layers, e.g., an oxide and a nitride layer, may have rougher surfaces than bare silicon, which may impact the bond strength. Thermally deposited oxide layers have a rougher surface than bare silicon, but the surface is generally sufficiently smooth to yield an acceptable bond. Nitride layers deposited by LPCVD nitride or oxide or nitride layers deposited by PECVD are not generally smooth enough to yield a strong enough bond.

Accordingly, in some embodiments, the wafers are subjected to chemical mechanical polishing to thereby provide wafers having surfaces smooth enough for bonding. During polishing, the front and/or back surfaces of the wafer are contacted with an aqueous slurry comprising an abrasive agent and a polymeric rheological modifier. In general, abrasive components of the polishing slurry comprise abrasive particles, e.g., colloidal silica, alumina, silicon carbide, diamond, boron carbide, tungsten carbide, titanium nitride, cesium oxide, etc. Polymeric rheological modifiers include polymers such as polyether polyol, pectin derivatives, polyacrylamide, polymethyacrylic acid, cellulosic stabilizers such as cellulose, modified cellulose derivatives, cellulose ethers, starch modified cellulose derivatives, cellulose ethers, starch derivatives, hydroxyethylcellulose, hydroxypropylcellulose, and hexaethyl cellulose. Other components may be included in the CMP liquid, as is known in the art. The polished wafers may be cleaned in SC1/SC2 solution and rinsed.

Chemical mechanical polishing may yield sufficiently smooth surfaces for wafer bonding. However, this requires deposition an additional thickness of the layer since CMP removes at least some of the deposited layer, which reduces throughput and adds manufacturing cost.

Accordingly, in some embodiments, wafer surfaces may be smoothed by ion milling. Ion milling uses physical etching to removal material. Typically, argon ions and/or helium ions can be accelerated under vacuum to impinge on the surface to be milled. Ions are produced in a vacuum discharge chamber by an electrical discharge between an electron emitting cathode and a surrounding anode at a voltage of up to about 2000 volts. A non-oxidizing atmosphere of argon, nitrogen, etc., is typically used in the vacuum chamber, at a pressure of the order of $1 \times 10^{-3}$ to $1 \times 1.0^{-6}$ torr at a current density of about 1 ma/cm$^2$ or less.

In substance, this treatment accelerates the ions to the surface being milled at an energy of up to about 2 keV. The ions are accelerated into a vacuum work chamber through collimating grids and a beam neutralizing filament. The collimated ions torn a beam that impinges on the workpiece that is normally disposed on a water cooled support. With beam current and ion energy independently adjustable over a broad range of values, etching rates of up to about 300 angstroms per minute can be obtained. If the ion beam angle is shallow with respect to the surface, high spots on the surface can be removed without removing material at the lowest points on the surface. This effectively smoothens and polishes the surface, without excessive removal of the deposited material. To be economical, the oxide or nitride deposited surface should be as smooth as possible. This may be accomplished by using, for example, a plasma source excited by microwaves (e.g. see Byungwhan Kim, Suyean Kim, Yong Ho Seo, Dong Hwan Kim, Sun Jae Kim, and Sang Chul Jung; "Surface Morphology of SiN Film Deposited by a Pulsed-Plasma Enhanced Chemical Vapor Deposition at Room Temperature;" J NANOSCI NANOTECHNO; (8); pp. 1-4; 2008).

Accordingly, in some embodiments of the method of the present invention, a handle wafer is first subjected to oxide deposition, including thermal oxidation or PECVD oxide deposition. Then, a smooth silicon nitride file is deposited by a nitride deposition technique, such as thermal nitridation, or microwave excited PECVD. The resultant wafer may be subjected to an optional densification anneal. After the optional anneal, the nitride surface is smoothed by chemical mechanical polishing or ion milling prior to bonding.

VII. Backside Layer Removal

In embodiments wherein a blanket deposition process is employed, e.g., thermal oxidation and/or LPCVD, the backside oxide and/or nitride layers will be removed at some point during the manufacture of the SOI multilayer structure. Removal of the backside layers may occur, for example, before wafer bonding, after wafer bonding but before mechanical cleaving, and after mechanical cleaving. The timing of the backside removal process may be varied, and each option has advantages and disadvantages. When the backside oxide and nitride are stripped from the handle wafer before bonding (and before CMP) the wafer may increase in warp because of the stress differences between the bond side (with layers) and the back side (without layers). Any damage to the bonding surface (e.g. due to HF acid vapors which may be used to remove the backside) may be recovered in the CMP process. Care must be taken to prevent the layers on the bond side from being etched by the backside etchant.

Alternatively, the handle and donor can be bonded, the SOI wafer formed by cleaving at the implant interface and the backside layers removed afterwards. This has the advantage that the bond surface of the handle wafer is complete and not damaged at the very edge of the wafer. However, if the SOI wafer needs to be clamped or mounted for backside removal, there could be damage to the SOI face, which ultimately needs to be clean, smooth and damage free.

If the backside layers are removed before CMP and bonding, there are several possibilities:
  i. Mask front side, plasma etch back side (nitride), wet etch oxide, strip resist, CMP nitride layer; or
  ii. Use a spin processor to wet etch backside film (exercising caution to prevent the etchant from wrapping around to front side), and CMP the nitride layer at the bond interface.

If the SOI wafer is bonded and the backside layers stripped later, this can be done by using a spin processor in which the wafer is mounted SOI face downward on an edge-gripping chuck or Bernoulli-type chuck.

Through the use of the "Stoney equation" for film stress, it may be possible to balance the stresses and minimize the net stress, to thereby result in minimal wafer bow in both embodiments. The Stoney equation is:

$$r = \frac{E_s \times t_S^2}{(1-v)_S \times 6 \times \sigma_f \times t_f}$$

Wherein r is the curvature of warpage, $t_S$ is the substrate thickness, $t_f$ is the film thickness, $\sigma_f$ is the film stress, $E_S$ is the Young's modulus of the substrate, and v is the Poisson's ratio of the substrate. The deposition of backside layers is advantageous because layers stresses may be balanced. In general, nitride layers exhibit tensile stress, while oxide layers exhibit compressive stress. The compressive stresses on frontside and backside oxide layers having equal thicknesses substantially balance, thereby minimizing wafer bow. In embodiments wherein deposition occurs only on the front side, the stresses of the front side oxide and nitride layers may be balanced though careful consideration of the composition of the layers and layer thicknesses. Still further, wafers having both backside and frontside layers of appropriate thicknesses and compositions may balance stresses even after removal of the backside layers.

Figure 4:
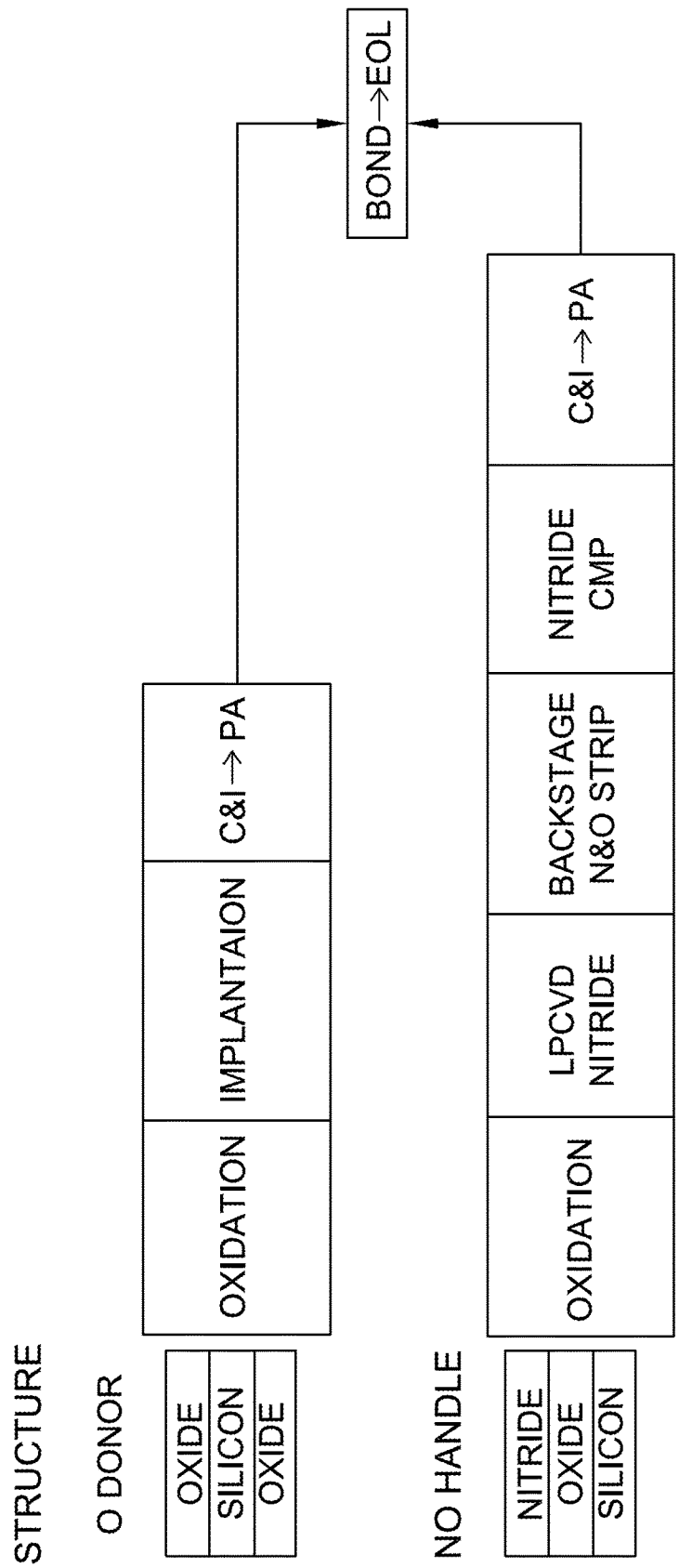
FIG. 4 depicts a process flow according to some embodiments of the present invention.

FIG. 4 depicts a process flow according to some embodiments of the present invention. The removal of the backside layers according to the embodiment depicted in FIG. 4 occurs before bonding. The donor wafer may be oxidized by any blanket deposition process, e.g., thermal oxidation. The handle wafer may be oxidized by any blanket deposition process, e.g., thermal oxidation, which is followed by blanket nitridation, e.g., LPCVD. After deposition, either or both wafers may be subjected to a densification anneal. If a densification anneal is required, preferably the anneal occurs before backside layer strip, as the warp of the wafer will be stabilized and the nitride layer on the bond face will be more resistant to damage from acid (HF) fumes. Also this process is preferably performed before the CMP or ion milling step, so that the nitride bond surface is CMP or ion-milled as the last mechanical operation to the bond surface before bonding (cleaning and inspections may still be required before plasma activation and bonding). Then, the nitride layer and oxide layers are stripped by an appropriate method, e.g., (single sided spin etch; or mask, Dry etch removal and/or immersion wet etch, and mask removal). For wet etching, oxide is stripped effectively using a standard hydrofluoric acid etching solution. For example, wet etching of silicon dioxide may occur using a buffered HF solution (6 parts ammonium fluoride (40% solution) and 1 part hydrogen fluoride (49% solution)). For nitride removal by wet etching, concentrated HF (50% aqueous HF) or a solution comprising HF (50% aqueous HF) and nitric acid (70% nitric acid) and water (e.g., in a 3:2:5 parts by volume solution). The compositions may be heated, e.g., 60° C. to 90° C., for faster removal rates. The etching solutions may additionally comprise acetic acid (HNA etching solutions) may be added to improve the sharpness of the transition from etched to non-etched edge at the interface. Preferably, the etching solution is prevented from wrapping around the edge of the handle wafer and destroying the layers on the region of the wafer which will form the terrace of the SOI wafer (or the bond between the donor and handle wafer at the terrace will not be strong enough and the layers (including top silicon may flake or not properly transfer in cleaving). The nitride bonding surface is subjected to an appropriate smoothing process, such as CMP or ion milling. Finally, both the donor and handle wafers may be subjected to cleaning and inspection. The wafers may be cleaned in conventional linear wet benches using ozonated water and SC1/SC2 chemistries. The cleaning tanks (particularly SC1) have megasonic transducers to aid in particle removal by microcavitation and/or acoustic streaming. Finally, the wafers are plasma activated. A plasma is produced at reduced pressure. This plasma alters the surface of the wafers to be bonded to enhance bonding (also increase hydrophilicity of the surface (water contact angle)). The processed handle wafer is then ready for bonding to the donor wafer.

VIII. Process Variations

The present invention therefore involves several process variations for yielding SOI structures comprising an ONO dielectric layer and no insulating layers on the handle wafer backside.

In some embodiments, manufacture of a semiconductor-on-oxide layer (e.g., a silicon-on-oxide layer) may have the following steps:

1. Single (e.g., front) sided deposition of an oxide layer (e.g., silicon dioxide) on the handle wafer by plasma enhanced chemical vapor deposition (PECVD);

2. Single (e.g., front) sided deposition of a nitride layer (e.g., silicon nitride) on the handle wafer by PECVD;

3. Optional densification anneal of the handle wafer;

4. Optional smoothing of the front surface of the handle wafer, particularly the silicon nitride layer, by chemical mechanical polishing (CMP) or ion milling; and 5. Bonding of the handle wafer, particularly, the silicon nitride layer, to an oxidized donor wafer, e.g., a silicon donor wafer comprising a front surface layer comprising silicon dioxide.

In some embodiments, manufacture of a semiconductor-on-oxide layer (e.g., a silicon-on-oxide layer) may have the following steps:

1. Double sided (e.g., front and back) deposition of an oxide layer (e.g., silicon dioxide) on the handle wafer by thermal oxidation;

2. Single (e.g., front) sided deposition of a nitride layer (e.g., silicon nitride) on the handle wafer by PECVD;

3. Optional densification anneal of the handle wafer;

4. Optional smoothing of the front surface of the handle wafer by chemical mechanical polishing (CMP) or ion milling;

5. Bonding of the handle wafer, particularly, the silicon nitride layer, to an oxidized donor wafer, e.g., a silicon donor wafer comprising a front surface layer comprising silicon dioxide; and 6. Backside oxide (e.g., silicon dioxide) removal from the back of the handle wafer by etching.

In some embodiments, manufacture of a semiconductor-on-oxide layer (e.g., a silicon-on-oxide layer) may have the following steps:

1. Double sided (e.g., front and back) deposition of an oxide layer (e.g., silicon dioxide) on the handle wafer by thermal oxidation;

2. Double sided (e.g., front and back) deposition of a nitride layer (e.g., silicon nitride) on the handle wafer by low pressure chemical vapor deposition (LPCVD);

3. Plasma etching back side of the handle wafer to remove the LPCVD deposited nitride layer;

4. Backside oxide (e.g., silicon dioxide) removal from the back of the handle wafer by etching;

5. Optional densification anneal of the handle wafer;

6. Optional smoothing of the front surface of the handle wafer by chemical mechanical polishing (CMP) or ion milling; and 7. Bonding of the handle wafer, particularly, the silicon nitride layer, to an oxidized donor wafer, e.g., a silicon donor wafer comprising a front surface layer comprising silicon dioxide.

In some embodiments, manufacture of a semiconductor-on-oxide layer (e.g., a silicon-on-oxide layer) may have the following steps:

1. Double sided (e.g., front and back) deposition of an oxide layer (e.g., silicon dioxide) on the handle wafer by thermal oxidation;

2. Single (e.g., front) sided deposition of a nitride layer (e.g., silicon nitride) on the handle wafer by LPCVD with masking of the front side of the handle wafer;

3. Backside oxide (e.g., silicon dioxide) removal from the back of the handle wafer by etching;

4. Stripping the mask;

5. Optional densification anneal of the handle wafer;

6. Optional smoothing of the front surface of the handle wafer by chemical mechanical polishing (CMP) or ion milling; and 7. Bonding of the handle wafer, particularly, the silicon nitride layer, to an oxidized donor wafer, e.g., a silicon donor wafer comprising a front surface layer comprising silicon dioxide.

Still other process variations fall within the scope of the present invention.

IX. Preparation of the Bonded Structure

With reference to FIG. 2, the single crystal semiconductor handle wafer 100, such as a single crystal silicon handle wafer, prepared according to the method described herein is next bonded to a single crystal semiconductor donor wafer 500, which is prepared according to conventional layer transfer methods. In preferred embodiments, the single crystal semiconductor donor wafer 500 comprises a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the single crystal semiconductor (e.g., silicon) donor wafer 500 may comprise electrically active dopants, such as boron (p type), gallium (p type), aluminum (p type), indium (p type), phosphorus (n type), antimony (n type), and arsenic (n type). The resistivity of the single crystal semiconductor (e.g., silicon) donor wafer may range from 1 to 50 Ohm-cm, typically, from 5 to 25 Ohm-cm. The single crystal semiconductor donor wafer 500 may be subjected to standard process steps including oxidation, implant, and post implant cleaning. Accordingly, a single crystal semiconductor donor wafer 500 that has been etched and polished and optionally oxidized is subjected to ion implantation to form a damage layer in the donor substrate.

In some embodiments, the single crystal semiconductor donor wafer 500 comprises a dielectric layer. The dielectric layer may comprise one or more insulating layers formed on the front surface of the single crystal semiconductor donor wafer 500. In some embodiments, the dielectric layer 420 comprises multiple layers of insulating material, for example, as depicted in FIG. 2, although other configurations are within the scope of this invention. Each insulating layer may comprise a material selected from the group consisting of silicon dioxide, silicon nitride, and silicon-oxynitride. Each insulating layer may have a thickness of at least about 1 nanometer thick, or at least about 10 nanometers thick, such as between about 10 nanometers and about 10,000 nanometers, between about 10 nanometers and about 5,000 nanometers, between 50 nanometers and about 500 nanometers, or between about 100 nanometers and about 400 nanometers, such as about 50 nanometers, about 75 nanometers, about 85 nanometers, about 100 nanometers, about 150 nanometers, about 175 nanometers, or about 200 nanometers. As depicted in FIG. 2, the dielectric layer 420 comprises three layers. One, two, or three of the layers may be formed upon the single crystal semiconductor handle wafer 100. One, two, or three of the layers may be formed upon the single crystal semiconductor donor wafer 500. Still further, one or two of the layers may be formed upon the single crystal semiconductor handle wafer 100, and one or two of the layers may be formed upon the single crystal semiconductor donor wafer 500.

Ion implantation may be carried out in a commercially available instrument, such as an Applied Materials Quantum II, a Quantum LEAP, or a Quantum X. Implanted ions include He, H, $H_2$, or combinations thereof. Ion implantation is carried out as a density and duration sufficient to form a damage layer in the semiconductor donor substrate. Implant density may range from about $10^{12}$ ions/cm$^2$ to about $10^{17}$ ions/cm$^2$, such as from about $10^{14}$ ions/cm$^2$ to about $10^{17}$ ions/cm$^2$, such as from about $10^{15}$ ions/cm$^2$ to about $10^{16}$ ions/cm$^2$. Implant energies may range from about 1 keV to about 3,000 keV, such as from about 10 keV to about 3,000 keV. Implant energies may range from about 1 keV to about 3,000 keV, such as from about 5 keV to about 1,000 keV, or from about 5 keV to about 200 keV, or from 5 keV to about 100 keV, or from 5 keV to about 80 keV. The depth of implantation determines the thickness of the single crystal semiconductor device layer in the final SOI structure. The ions may be implanted to a depth between about 100 angstroms and about 30,000 angstroms, such as between about 200 angstroms and about 20,000 angstroms, such as between about 2000 angstroms and about 15,000 angstroms, or between about 15,000 angstroms and about 30,000 angstroms. In some embodiments it may be desirable to subject the single crystal semiconductor donor wafers, e.g., single crystal silicon donor wafers, to a clean after the implant. In some preferred embodiments, the clean could include a Piranha clean followed by a DI water rinse and SC1/SC2 cleans.

In some embodiments of the present invention, the single crystal semiconductor donor wafer 500 having an ion implant region therein formed by He$^+$, H$^+$, H$_2^+$, and any combination thereof ion implant is annealed at a temperature sufficient to form a thermally activated cleave plane in the single crystal semiconductor donor substrate. An example of a suitable tool might be a simple Box furnace, such as a Blue M model. In some preferred embodiments, the ion implanted single crystal semiconductor donor substrate is annealed at a temperature of from about 200° C. to about 350° C., from about 225° C. to about 325° C., preferably about 300° C. Thermal annealing may occur for a duration of from about 2 hours to about 10 hours, such as from about 2 hours to about 8 hours. Thermal annealing within these temperatures ranges is sufficient to form a thermally activated cleave plane. After the thermal anneal to activate the cleave plane, the single crystal semiconductor donor substrate surface is preferably cleaned.

In some embodiments, the ion-implanted and optionally cleaned and optionally annealed single crystal semiconductor donor wafer 500 is subjected to oxygen plasma and/or nitrogen plasma surface activation. In some embodiments, the oxygen plasma surface activation tool is a commercially available tool, such as those available from EV Group, such as EVG®810LT Low Temp Plasma Activation System. The ion-implanted and optionally cleaned single crystal semiconductor donor wafer is loaded into the chamber. The chamber is evacuated and backfilled with $O_2$ to a pressure less than atmospheric to thereby create the plasma. The single crystal semiconductor donor wafer is exposed to this plasma for the desired time, which may range from about 1 second to about 120 seconds. Oxygen plasma surface oxidation is performed in order to render the front surface of the single crystal semiconductor donor substrate hydrophilic and amenable to bonding to a single crystal semiconductor handle substrate prepared according to the method described above.

The hydrophilic front surface of the single crystal semiconductor donor wafer 500 and the front surface of single crystal semiconductor handle wafer 100 are next brought into intimate contact to thereby form a bonded structure. According to the methods of the present invention, each of the front surface of the single crystal semiconductor donor wafer 500 and the front surface of single crystal semiconductor handle wafer 100 may comprise one or more insulating layers. The insulating layers form the dielectric layer of the bonded structure. With reference to FIG. 2, an exemplary dielectric layer 420 is shown. As depicted therein, the dielectric layer 420 of the bonded structure may comprise a first oxide layer 200, a nitride layer 300, a second oxide layer 400. Further configurations are within the scope of this disclosure.

Since the mechanical bond may be relatively weak, the bonded structure may be further annealed to solidify the bond between the single crystal semiconductor donor wafer 500 and the single crystal semiconductor handle wafer 100. In some embodiments of the present invention, the bonded structure is annealed at a temperature sufficient to form a thermally activated cleave plane in the single crystal semiconductor donor substrate. An example of a suitable tool might be a simple Box furnace, such as a Blue M model. In some embodiments, the bonded structure is annealed at a temperature of from about 200° C. to about 400° C., from about 300° C. to about 400° C., such as from about 350° C. to about 400° C.

In some embodiments, the anneal may occur at relatively high pressures, such as between about 0.5 MPa and about 200 MPa, such as between about 0.5 MPa and about 100 MPa, such as between about 0.5 MPa and about 50 MPa, or between about 0.5 MPa and about 10 MPa, or between about 0.5 MPa and about 5 MPa. In conventional bonding methods, the temperature is likely limited by the "autocleave". This occurs when the pressure of the platelets at the implant plane exceeds the external isostatic pressure. Accordingly, conventional anneal may be limited to bonding temperatures between about 350° C. and about 400° C. because of autocleave. After implantation and bond, the wafers are weakly held together. But the gap between the wafers is sufficient to prevent gas penetration or escape. Weak bonds can be strengthened by heat treatments, but the cavities formed during implant are filled with gas. While heating, the gas inside the cavities pressurizes. It is estimated that the pressure may reach 0.2-1 GPa (Cherkashin et al., J. Appl. Phys. 118, 245301 (2015)), depending on the dosage. When the pressure exceeds a critical value, the layer delaminates. This is referred to as an autocleave or thermal cleave. It prevents higher temperature or longer time in the anneal.

According to some embodiments of the present invention, bonding occurs at elevated pressures, e.g., between about 0.5 MPa and about 200 MPa, such as between about 0.5 MPa and about 100 MPa, such as between about 0.5 MPa and about 50 MPa, or between about 0.5 MPa and about 10 MPa, or between about 0.5 MPa and about 5 MPa, which thereby enables bonding at elevated temperatures. In some embodiments, the bonded structure is annealed at a temperature of from about 300° C. to about 700° C., from about 400° C. to about 600° C., such as between about 400° C. and about 450° C., or even between about 450° C. and about 600° C., or between about 350° C. and about 450° C. Increasing the thermal budget will have a positive effect on the bond strength. Thermal annealing may occur for a duration of from about 0.5 hours to about 10 hour, such as between about 0.5 hours and about 3 hours, preferably a duration of about 2 hours. Thermal annealing within these temperatures ranges is sufficient to form a thermally activated cleave plane. In conventional bonding anneals, the edge of both the handle wafer and donor wafer may become far apart due to the roll off. In this area, there is no layer transfer. It is called the terrace. Pressurized bonding is expected to reduce this terrace, extending the SOI layer further out towards the edge. The mechanism is based on trapped pockets of air being compressed and "zippering" outwards. After the thermal anneal to activate the cleave plane, the bonded structure may be cleaved.

Figure 3:
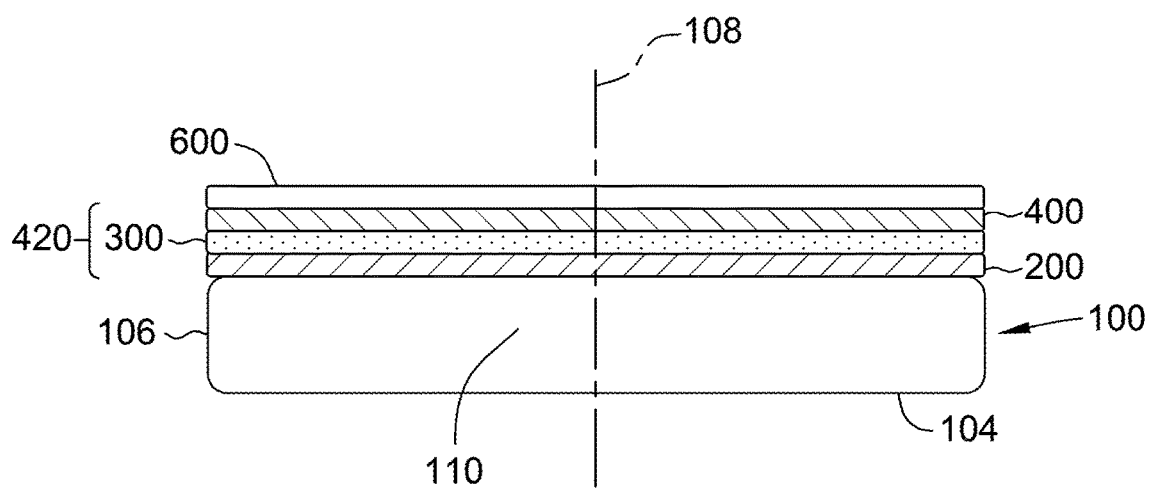
FIG. 3 depicts a multilayer structure according to some embodiments of the present invention.

After the thermal anneal, the bond between the single crystal semiconductor donor wafer 500 and the single crystal semiconductor handle wafer 100 is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the semiconductor donor wafer, thereby leaving a single crystal semiconductor device layer 600, preferably a silicon device layer, on the semiconductor-on-insulator composite structure. See FIG. 3.

After cleaving, the cleaved structure may be subjected to a high temperature anneal in order to further strengthen the bond between the transferred device layer 600 and the single crystal semiconductor handle wafer 100. An example of a suitable tool might be a vertical furnace, such as an ASM A400. In some preferred embodiments, the bonded structure is annealed at a temperature of from about 1000° C. to about 1200° C., preferably at about 1000° C. Thermal annealing may occur for a duration of from about 0.5 hours to about 8 hours, preferably a duration of about 4 hours. Thermal annealing within these temperatures ranges is sufficient to strengthen the bond between the transferred device layer and the single crystal semiconductor handle substrate.

After the cleave and high temperature anneal, the bonded structure may be subjected to a cleaning process designed to remove thin thermal oxide and clean particulates from the surface. In some embodiments, the single crystal semiconductor device layer may be brought to the desired thickness and smoothness by subjecting to a vapor phase HCl etch process in a horizontal flow single wafer epitaxial reactor using $H_2$ as a carrier gas. In some embodiments, the semiconductor device layer 600 may have a thickness between about 20 nanometers and about 3 micrometers, such as between about 20 nanometers and about 2 micrometers, such as between about 20 nanometers and about 1.5 micrometers or between about 1.5 micrometers and about 3 micrometers.

In some embodiments, an epitaxial layer may be deposited on the transferred single crystal semiconductor device layer 600. A deposited epitaxial layer may comprise substantially the same electrical characteristics as the underlying single crystal semiconductor device layer 600. Alternatively, the epitaxial layer may comprise different electrical characteristics as the underlying single crystal semiconductor device layer 600. An epitaxial layer may comprise a material selected from the group consisting of silicon, silicon carbide, silicon germanium, gallium arsenide, gallium nitride, indium phosphide, indium gallium arsenide, germanium, and combinations thereof. Depending upon the desired properties of the final integrated circuit device, the epitaxial layer may comprise electrically active dopants, such as boron (p type), gallium (p type), aluminum (p type), indium (p type), phosphorus (n type), antimony (n type), and arsenic (n type). The resistivity of the epitaxial layer may range from 1 to 50 Ohm-cm, typically, from 5 to 25 Ohm-cm. In some embodiments, the epitaxial layer may have a thickness between about 20 nanometers and about 3 micrometers, such as between about 20 nanometers and about 2 micrometers, such as between about 20 nanometers and about 1.5 micrometers or between about 1.5 micrometers and about 3 micrometers.

The finished SOI wafer comprises the single crystal semiconductor handle wafer 100, the dielectric layer 420, and the semiconductor device layer 600, may then be subjected to end of line metrology inspections and cleaned a final time using typical SC1-SC2 process.

The following non-limiting examples illustrate embodiments of the present invention.

EXAMPLES

Comparative Example 1

Fabrication of SOI Wafers with No Backside Removal

This comparative example illustrates SOI manufacture lacking any process steps to remove the backside layers. Twenty-five (25) 200 mm diameter single crystal silicon p-type (boron doped) wafers having resistivity of 15 to 16 Ω-cm were prepared. The oxygen concentration was measured to be 8.0 PPMA (SEMI MF 1188-1105). These wafers are the handle wafers of the final ONO SOI structure. The handle wafers were oxidized by wet thermal oxidation in an ASM A400XT vertical tube to envelope the wafers with a silicon dioxide layer having a nominal oxide thickness of 200 nm. The wafers were subjected to LPCVD nitride deposition in a tube furnace to envelope the wafers with a deposited nitride thickness target of 175 nm. The bond surface of each of twenty-five wafers was chemically mechanically polished using a Mirra Mesa 200 mm CMP tool with silica polishing slurry to a target thickness of 75 nm. For the set-up, the first six wafers of the lot were polished for different durations, cleaned, and then the nitride layer thickness measured to establish the removal rate and set the CMP polish time. Then, the remaining 19 wafers were polished at the set polish time. The wafers were cleaned and measured for nitride layer thickness, flatness, warp, and KLA Tencor SP1 surface inspection. One wafer (one of the original six polish rate set-up wafers) was subjected to metals sampling, leaving 24 wafers for bonding.

A parallel group of twenty-five (25) 200 mm diameter donor silicon p-type (boron doped) wafers having resistivity of 9.5 Ω-cm were prepared. The oxygen concentration was measured to be 8.0 PPMA (SEMI MF 1188-1105). The donor wafers were oxidized by wet thermal oxidation in an ASM A400XT vertical tube to envelope the wafers with a silicon dioxide layer having a nominal oxide thickness of 200 nm. Cleaning and surface inspection processes followed to remove any particles generated by the oxidation process or wafer handling during oxide metrology and flatness/warp measurement. Next, three donor wafers were implanted using an Applied Materials Quantum X ion implanter, first with helium (dose $1.1 \times 10^{16}$ atoms/cm$^2$ using an energy of 60 KeV) and followed with $H_2^+$ ions (dose $0.55 \times 10^{16}$ atoms/cm$^2$ using an energy of 71 KeV). The donor wafers passed through a series of rough and fine cleaning and inspection to remove any contaminants or particles produced by the implantation process or handling. This produced a uniform, clean particle-free surface required for good bonding.

The twenty-four handle wafers comprising NO dielectric layers prepared as described above were bonded to 24 of the donor wafers produced as described above. The protocol to prepare SOI structures was as follows:

(a) Pairing: A pair of wafers was sequenced so that a donor wafer was matched with a handle wafer;

(b) Plasma Activation: The bond interface of the donor wafer and the bond interface of the handle wafer for each pair were plasma activated using an EVG 800 low-temperature series plasma activation using nitrogen gas at low pressure (~0.45 mbar) and a top electrode power of ~60 W at a frequency of ~400 kHz and a bottom electrode power of ~500 W at a frequency of ~50 kHz. The electrodes were energized (at operating pressure) for a total of 15 s. The plasma activation was done sequentially (one bond surface at a time) for donor bond surface and handle bond surface;

(c) Rinsing: Each wafer was removed from the plasma activation chamber and the activated bond surface is rinsed in deionized wafer. The rinsed wafers were spun dry;

(d) Contact Bonding: The donor and handle bond pair was arranged in a bond chamber with bond surface facing each other. The bond chamber pressure was reduced to about 150 mbar, and the wafers were intimately contacted. The wafer separation was limited by Van der Waal's repulsive forces. A contact pin was applied to the external surface of the donor wafer near an edge. The contact force is greater than the local Van der Waal's repulsive force. The contact pin force caused a bond wave to emanate from the contact point and within the confines of the wave the two bond surfaces bonded. The bond wave moved outward to the edges in all direction. Once the wave completely moved to the edge at the entire circumference of the bond pair the bonding process (for this stage) is complete;

(e) Anneal: The twenty-four bond pairs were collected in a process cassette. The bond pairs were annealed to strengthen the bond in a Lindbergh Blue M convection oven at a temperature ranging from about 250° C. to about 375° C. for between 1 to 4 hours. The anneal additionally nucleates and grows hydrogen and helium filled platelets along the implantation plane in the donor wafer. Anneals at temperatures in the range of 425 to 475° C. or higher may cause the platelets to grow and merge into one another forming a cleave plane, which could result in thermal cleaving. In this example, the wafers were bond annealed at 350° C. for 2 hours (with ramp-up and ramp-down time collectively of 35 minutes);

(f) Mechanical Cleaving: Upon cooling sufficiently, the bond pairs were mechanically cleaved to form the SOI wafer with ONO BOX structure. The structures were cleaved by chucking the bond pair with handle side down. A series of suction cups (with vacuum applied) mounted on a pivoting upper arm applied an upward force to the donor wafer. A razor blade was moved to contact the bond pair between edge contours and apply a force. The force of the razor blade initiated a crack in the donor wafer. The crack reaches the depth of the implant plane (zone) filled with platelets and micro-fractures. The crack spreads in all directions with the applied stress from the upper arm pulling on the back side of the donor wafer. The remnant of the donor wafer separated from the newly-formed SOT wafer and this remnant/spent donor wafer was peeled away from the SOT wafer as the cleave wave propagates;

(g) Surface cleaning and inspection: The newly-formed SOI wafers were cleaned and inspected to remove any particles which may have been produced in cleaving or wafer handling. The thickness of the layers (bottom oxide, nitride, top oxide and top-silicon) and flatness or warp were measured;

(h) Strengthening anneal: The structures were annealed to further strengthen the bond interface at 1000° C. for 4 hrs (pre-epitaxy smoothing anneal, or PESA). The structures are cleaned to remove oxide that may form during the anneal; and (i) Epitaxial thinning: Cleave damage was removed and the top silicon layer was thinned in an epitaxy reactor. The top silicon was thinned from approximately 225 nm to a target of 148 nm. Afterwards, the wafers were cleaning and inspected. The cleaning process removes about 3 nm leaving the final top silicon thickness of 145 nm. The top oxide thickness is about 200 nm, the nitride thickness is about 75 nm and the bottom oxide thickness is about 200 nm.

The nitride-to-oxide bond quality using this process was excellent. TEM cross-section images of the bond interfaces showed no apparent voids or incomplete bond surfaces. Also, HF undercut data (examination of the wicking inward of HF at the bond interface) was very low, averaging about 2.5 micrometers. Typically, SOT wafers made using a lower temperature so-called PESA process exhibit higher HF undercut of at least 10 micrometers and often near 50 micrometers or above. This is due to the fact that at the lower-temperature PESA process the oxide does not flow, while at the higher temperatures (e.g. 1125° C.) the oxide does flow. However, at higher temperatures, wafer is more prone to slip and possibly for some SOI products (e.g. Charge-Trap-Layer (CTL) SOT wafers) the higher temperatures will force the polysilicon CTL layer to recrystallize resulting in a loss in functionality (reduction of HD2 losses).

Example 2

Fabrication of SOI Wafers with Handle Substrates Subjected to Single Sided Oxide and Nitride Deposition Three handle silicon wafers (200 mm diameter) were subjected to a PECVD oxide deposition process, which deposited a PECVD oxide layer having a thickness of 200 nm onto the bonding surface. The deposition tool was a LAM Sequel C2. Atop the PECVD oxide layer was deposited a 175 nm thick layer of PECVD nitride using the same PECVD deposition tool. One wafer was subjected to a densification anneal in which a wafer subject annealed for 4 hours at 1100° C. in atmospheric-pressure nitrogen ambient. Two wafers (one of which was densified) are chemically mechanically polished on a Mira Mesa CMP tool to leave a nitride layer thickness of about 75 nm. Accordingly, one handle wafer was neither densified nor polished. Post-polish cleaning process followed to produce a clean, dry surface. A fine clean and surface inspection was then performed to produce a uniform, clean, particle-free surface required for good bonding.

Three donor wafers were oxidized by wet thermal oxidation in an ASM A400XT vertical tube to envelope the wafers with a silicon dioxide layer having a nominal oxide thickness of 200 nm. Cleaning and surface inspection processes followed to remove any particles generated by the oxidation process or wafer handling during oxide metrology and flatness/warp measurement. Next, three donor wafers were implanted using an Applied Materials Quantum X ion implanter, first with helium (dose $1.1 \times 10^{16}$ atoms/cm$^2$ using an energy of 60 KeV) and followed with $H_2^+$ ions (dose $0.55 \times 10^{16}$ atoms/cm$^2$ using an energy of 71 KeV). The donor wafers passed through a series of rough and fine cleaning and inspection to remove any contaminants or particles produced by the implantation process or handling. This produced a uniform, clean particle-free surface required for good bonding.

The protocol to prepare SOI structures was as follows:

(a) Pairing: A pair of wafers was sequenced so that a donor wafer was matched with a handle wafer;

(b) Plasma Activation: The bond interface of the donor wafer and the bond interface of the handle wafer for each pair were plasma activated using an EVG 800 low-temperature series plasma activation using nitrogen gas at low pressure (~0.45 mbar) and a top electrode power of ~60 W at a frequency of ~400 kHz and a bottom electrode power of ~500 W at a frequency of ~50 kHz. The electrodes were energized (at operating pressure) for a total of 15 s. The plasma activation was done sequentially (one bond surface at a time) for donor bond surface and handle bond surface;

(c) Rinsing: Each wafer was removed from the plasma activation chamber and the activated bond surface is rinsed in deionized wafer. The rinsed wafers were spun dry;

(d) Contact Bonding: The donor and handle bond pair was arranged in a bond chamber with bond surface facing each other. The bond chamber pressure was reduced to about 150 mbar, and the wafers were intimately contacted. The wafer separation was limited by Van der Waal's repulsive forces. A contact pin was applied to the external surface of the donor wafer near an edge. The contact force is greater than the local Van der Waal's repulsive force. The contact pin force caused a bond wave to emanate from the contact point and within the confines of the wave the two bond surfaces bonded. The bond wave moved outward to the edges in all direction. Once the wave completely moved to the edge at the entire circumference of the bond pair the bonding process (for this stage) is complete;

(e) Anneal: The bond pairs were collected in a process cassette. The bond pairs were annealed to strengthen the bond in a Lindbergh Blue M convection oven at a temperature ranging from about 250° C. to about 375° C. for between 1 to 4 hours. The anneal additionally nucleates and grows hydrogen and helium filled platelets along the implantation plane in the donor wafer. Anneals at temperatures in the range of 425 to 475° C. or higher may cause the platelets to grow and merge into one another forming a cleave plane, which could result in thermal cleaving. In this example, the wafers were bond annealed at 350° C. for 2 hours (with ramp-up and ramp-down time collectively of 35 minutes);

(f) Mechanical Cleaving: Upon cooling sufficiently, the bond pairs were mechanically cleaved to form the SOI wafer with ONO BOX structure. The structures were cleaved by chucking the bond pair with handle side down. A series of suction cups (with vacuum applied) mounted on a pivoting upper arm applied an upward force to the donor wafer. A razor blade was moved to contact the bond pair between edge contours and apply a force. The force of the razor blade initiated a crack in the donor wafer. The crack reaches the depth of the implant plane (zone) filled with platelets and micro-fractures. The crack spreads in all directions with the applied stress from the upper arm pulling on the back side of the donor wafer. The remnant of the donor wafer separated from the newly-formed SOI wafer and this remnant/spent donor wafer was peeled away from the SOI wafer as the cleave wave propagates;

(g) Surface cleaning and inspection: The newly-formed SOI wafers were cleaned and inspected to remove any particles which may have been produced in cleaving or wafer handling. Surface inspection (e.g. KLA Tencor SP1) and visual inspection revealed that the ONO SOI wafer which was made using PECVD nitride deposited over PECVD oxide and which was not polished prior to bonding had layer transfer defects (voids). The thickness of the layers (bottom oxide, nitride, top oxide and top-silicon) and flatness or warp were measured;

(h) Strengthening anneal: The structures were annealed to further strengthen the bond interface at 1125° C. for 4 hrs (pre-epitaxy smoothing anneal, or PESA). This anneal may be at temperatures ranging from 1000° C. to 1125° C. for times ranging from 2 hrs. to 4 hrs. The structures are cleaned to remove oxide that may form during the anneal; and (i) Epitaxial thinning: Cleave damage was removed and the top silicon layer was thinned in an epitaxy reactor. The top silicon was thinned from approximately 225 nm to a target of 148 nm. Afterwards, the wafers were cleaning and inspected. The cleaning process removes about 3 nm leaving the final top silicon thickness of 145 nm. The top oxide thickness is about 200 nm, the nitride thickness is about 75 nm and the bottom oxide thickness is about 200 nm.

Figure 5A:
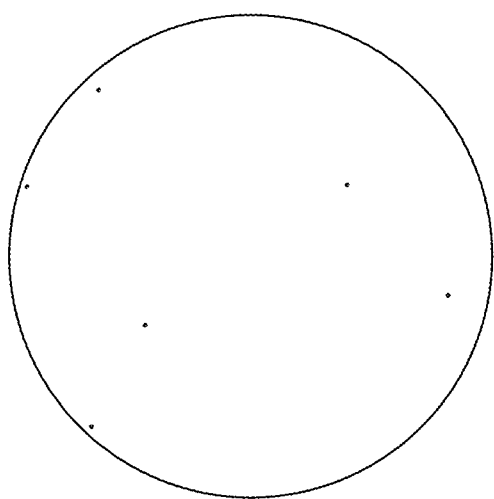
FIGS. 5A and 5B depict light point defect density maps for two wafers prepared according to the method described in Example 2.
Figure 5B:
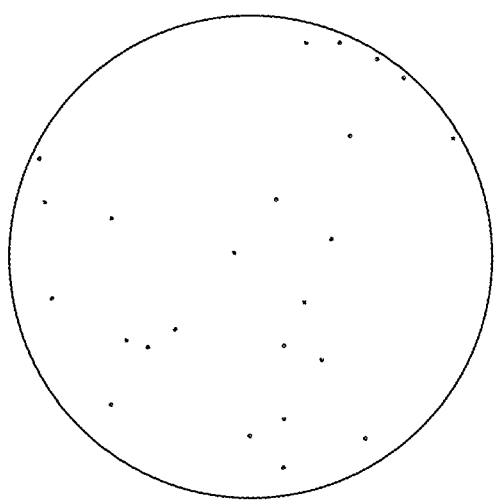

FIGS. 5A and 5B depict light point defect density maps for two wafers prepared according to this example. The LPD were measured using a KLA Tencor SP1 surface inspection too. FIG. 5A depicts the LPD density for the wafer subjected to densification and polishing. FIG. 5B depicts the LPD density for the wafer that was not densified before polishing. The maps show good layer transfer and low defectivity.

Table 1 shows the warp of the wafers at the end of the line. The wafers would warp due to film stress difference between the front side (with layers) and the back side (without layers). The annealing process appears to reduce warp. This may be explained by understanding that the annealing process will shrink the layer thickness. If this is done before CMP, the material removal for CMP will be less (in this case about 20 nm less).

TABLE 1

Warp for Example 2 Wafers

| | Process | Warp, μm |
|---|---|---|
| A | PECVD oxide + PECVD nitride + anneal + CMP | 16.46 |
| B | PECVD oxide + PECVD nitride + CMP | 22.06 |

Figure 6A:
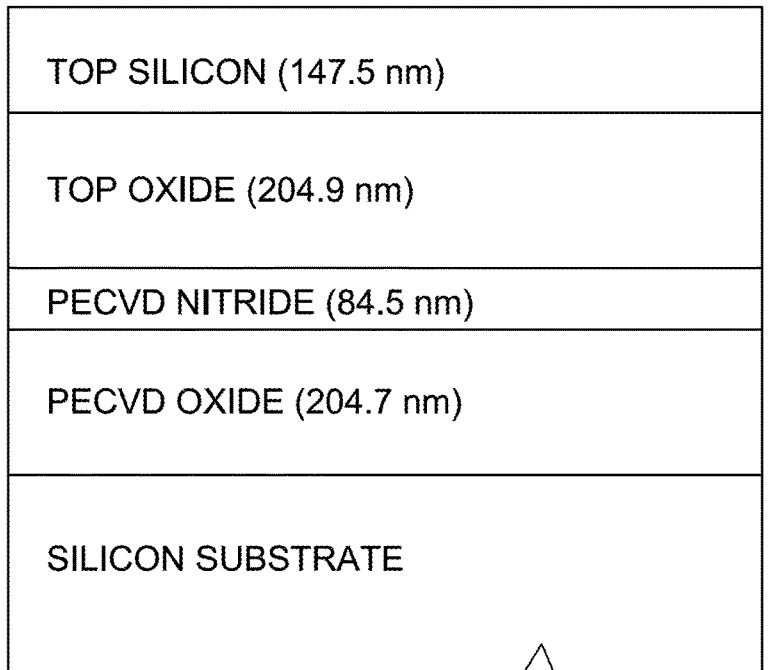
FIGS. 6A and 6B are TEM cross-section images of the bond interface between the handle nitride and the donor oxide for two wafers prepared according to the method described in Example 2.
Figure 6B:
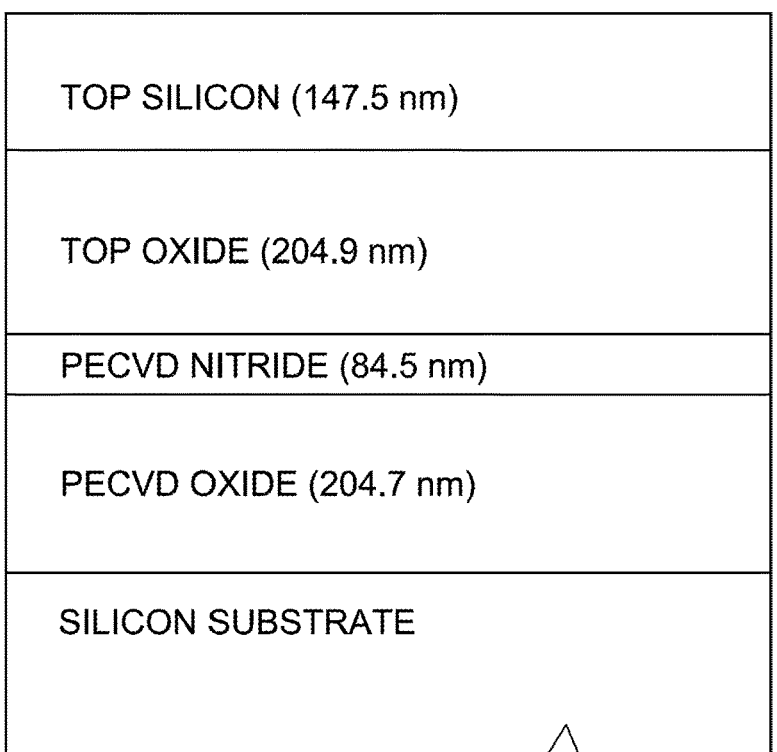

FIGS. 6A and 6B are TEM cross-section images of the bond interface between the handle nitride and the donor oxide. FIG. 6A depicts the interface for the wafer subjected to densification and polishing. FIG. 6B depicts the interface for the wafer that was not densified before polishing. The bond between the nitride (handle) and oxide (donor) is good and there are no visible cracks, voids or splits at the interface. The interface appears similar to the interface between the handle (PECVD) oxide and the handle (PECVD) nitride deposited on top of the PECVD oxide. Owing to the rough surface produced by PECVD oxide (and no CMP to smoothen this layer) the interface between the PECVD oxide and nitride is rougher than the opposite interface between the polished nitride and the (relatively smooth) thermal oxide.

Example 3

Fabrication of SOI Wafers with Handle Substrates Subjected to Double Sided Oxide and Single Sided Nitride Deposition Three handle silicon wafers (200 mm diameter) were subjected to a thermal oxidation process, which enveloped the wafer with a thermal oxide layer having a thickness of 200 nm. Atop the thermal oxide layer was deposited a 175 nm thick layer of PECVD nitride using the same PECVD deposition tool. One wafer was subjected to a densification anneal in which a wafer subject annealed for 4 hours at 1100° C. in atmospheric-pressure nitrogen ambient. Two wafers (one of which was densified) are chemically mechanically polished on a Mira Mesa CMP tool to leave a nitride layer thickness of about 75 nm. Accordingly, one handle wafer was neither densified nor polished. Post-polish cleaning process followed to produce a clean, dry surface. A fine clean and surface inspection was then performed to produce a uniform, clean, particle-free surface required for good bonding.

Three donor wafers were oxidized by wet thermal oxidation in an ASM A400XT vertical tube to envelope the wafers with a silicon dioxide layer having a nominal oxide thickness of 200 nm. Cleaning and surface inspection processes followed to remove any particles generated by the oxidation process or wafer handling during oxide metrology and flatness/warp measurement. Next, three donor wafers were implanted using an Applied Materials Quantum X ion implanter, first with helium (dose $1.1 \times 10^{16}$ atoms/cm$^2$ using an energy of 60 KeV) and followed with $H_2^+$ ions (dose $0.55 \times 10^{16}$ atoms/cm$^2$ using an energy of 71 KeV). The donor wafers passed through a series of rough and fine cleaning and inspection to remove any contaminants or particles produced by the implantation process or handling. This produced a uniform, clean particle-free surface required for good bonding.

Figure 7A:
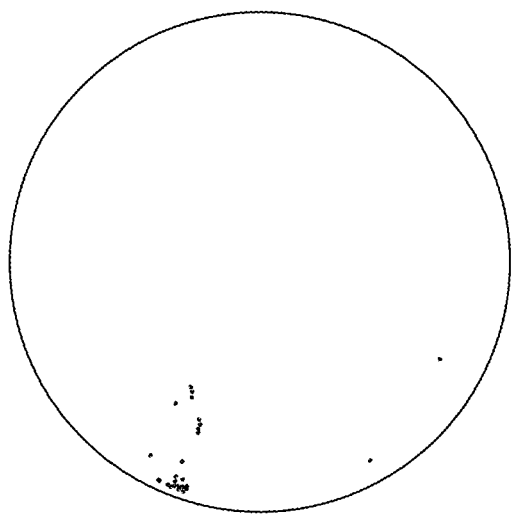
FIGS. 7A and 7B depict light point defect density maps for two wafers prepared according to the method described in Example 3.
Figure 7B:
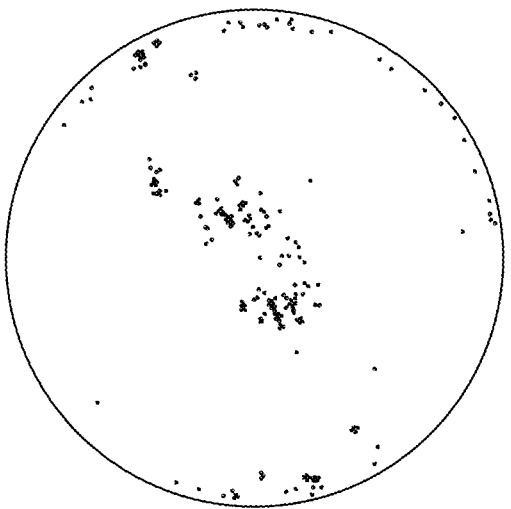

The three handle wafers are then bonded to the three oxidized donor wafers under the identical protocol as disclosed in Example 2. FIGS. 7A and 7B depict light point defect density maps for two wafers prepared according to this example. The LPD were measured using a KLA Tencor SP1 surface inspection too. FIG. 7A depicts the LPD density for the wafer subjected to densification and polishing. FIG. 7B depicts the LPD density for the wafer that was not densified before polishing. The surface defectivity was higher with these wafers as compared to the wafers prepared according to the method of Example 2. The non-densification anneal wafer was thermally cleaved. Thermal cleaving occurs when the wafer cleaves during the bond anneal. It may be possible to prevent thermal cleaving if the temperature and/or time of the bond strengthening anneal process is reduced.

Table 2 shows the warp of the wafers at the end of the line. The wafers would warp due to film stress difference between the front side (with layers) and the back side (without layers). The annealing process appears to reduce warp. This may be explained by understanding that the annealing process will shrink the layer thickness. If this is done before CMP, the material removal for CMP will be less (in this case about 20 nm less).

TABLE 2

Warp for Example 3 Wafers

| Process | Warp, μm |
|---|---|
| A thermal oxide + PECVD nitride + anneal + CMP | 5.36 |
| B thermal oxide + PECVD nitride + CMP | 9.45 |

Comparing tables 1 and 2, it is apparent that wafers with thermal oxide have less warp, since the film stresses are the same on both sides. If the oxide is removed from the backside of the wafer, the warp will increase. The backside thermal oxidation layer may be removed by a spin processor using a Bernoulli chuck (to protect the SOI top silicon surface).

Figure 8A:
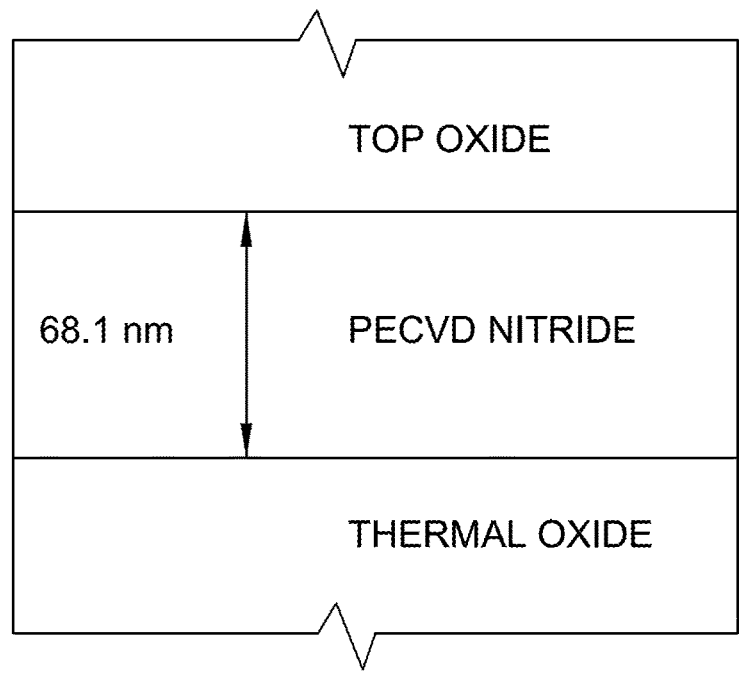
FIGS. 8A and 8B are TEM cross-section images of the bond interface between the handle nitride and the donor oxide for two wafers prepared according to the method described in Example 3.
Figure 8B:
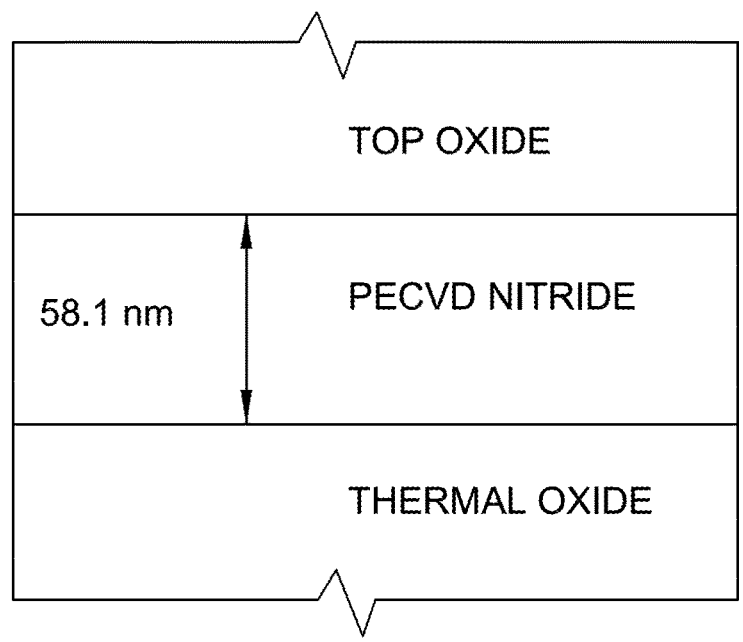

FIGS. 8A and 8B are TEM cross-section images of the bond interface between the handle nitride and the donor oxide. FIG. 8A depicts the interface for the wafer subjected to densification and polishing. FIG. 8B depicts the interface for the wafer that was not densified before polishing. The bond between the nitride (handle) and oxide (donor) is good and there are no visible cracks, voids or splits at the interface.

Example 4

Fabrication of SOI Wafers with Handle Substrates Subjected to Double Sided Oxide and Double Sided Nitride Deposition Three handle silicon wafers (200 mm diameter) were subjected to a thermal oxidation process, which enveloped the wafer with a thermal oxide layer having a thickness of 200 nm. Atop the thermal oxide layer was deposited a 175 nm thick layer of LPCVD nitride. The wafers were masked on the front side. The nitride layer on the backside of the handle wafer was removed by plasma etching. The plasma etching was terminated before the oxide was removed (to prevent the bare backside surface from being cosmetically altered by the plasma etch. The oxide was then stripped using wet HF etching. Finally, the front-side mask was removed. This produces wafers with no layers on the back side.

One wafer was subjected to a densification anneal in which a wafer subject annealed for 4 hours at 1100° C. in atmospheric-pressure nitrogen ambient. Two wafers (one of which was densified) are chemically mechanically polished on a Mira Mesa CMP tool to leave a nitride layer thickness of about 75 nm. Accordingly, one handle wafer was neither densified nor polished. Post-polish cleaning process followed to produce a clean, dry surface. A fine clean and surface inspection was then performed to produce a uniform, clean, particle-free surface required for good bonding.

Three donor wafers were oxidized by wet thermal oxidation in an ASM A400XT vertical tube to envelope the wafers with a silicon dioxide layer having a nominal oxide thickness of 200 nm. Cleaning and surface inspection processes followed to remove any particles generated by the oxidation process or wafer handling during oxide metrology and flatness/warp measurement. Next, three donor wafers were implanted using an Applied Materials Quantum X ion implanter, first with helium (dose $1.1 \times 10^{16}$ atoms/cm$^2$ using an energy of 60 KeV) and followed with H$_2^+$ ions (dose $0.55 \times 10^{16}$ atoms/cm$^2$ using an energy of 71 KeV). The donor wafers passed through a series of rough and fine cleaning and inspection to remove any contaminants or particles produced by the implantation process or handling. This produced a uniform, clean particle-free surface required for good bonding.

Figure 9A:
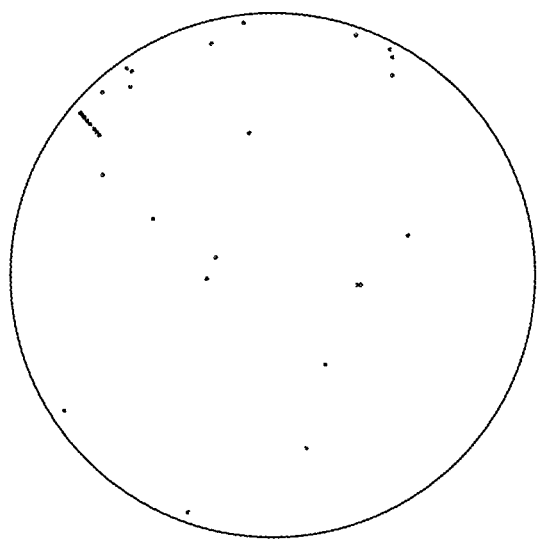
FIGS. 9A and 9B depict light point defect density maps for two wafers prepared according to the method described in Example 3.
Figure 9B:
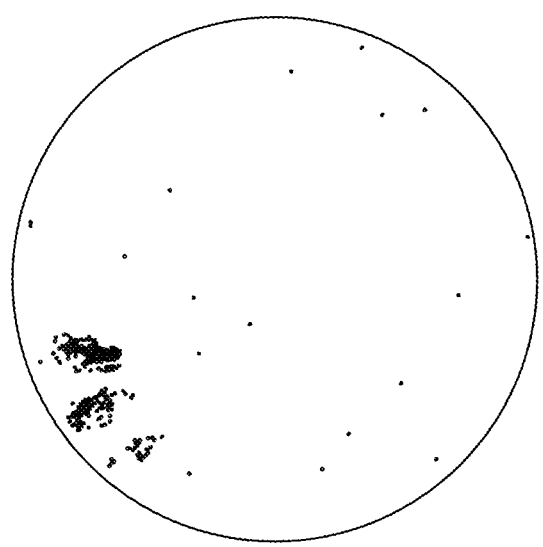

The three handle wafers are then bonded to the three oxidized donor wafers under the identical protocol as disclosed in Example 2. FIGS. 9A and 9B depict light point defect density maps for two wafers prepared according to this example. The LPD were measured using a KLA Tencor SP1 surface inspection too. FIG. 9A depicts the LPD density for the wafer subjected to densification and polishing. FIG. 9B depicts the LPD density for the wafer that was not densified before polishing. The wafer depicted in FIG. 8B had a scratch in the nitride layer, revealed in the surface map on the lower left hand side.

Table 3 shows the warp of the bare wafers, after stripping the backside layers, and at the end of the line. It is apparent that warp increases with the backside layers stripped.

TABLE 3

Warp for Example 4 Wafers

| Process | Bare Handle Wafer Warp, μm | Handle Wafer Warp after Layer Strip, μm | EOL SOI Wafer Warp, μm |
|---|---|---|---|
| A thermal oxide + PECVD nitride + anneal + CMP | 4.77 | 6.43 | 28.53 |
| B thermal oxide + PECVD nitride + CMP | 4.83 | 6.10 | 29.39 |

Having described the invention in detail, it will be apparent that modifications and variations are possible without departing from the scope of the invention defined in the appended claims.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

We claim:

1. A method of preparing a multilayer structure, the method comprising:
    (a) forming a front handle silicon dioxide layer on a front handle surface of a single crystal silicon handle wafer and a back handle silicon dioxide layer on a back handle surface of a single crystal silicon handle wafer, wherein the single crystal silicon handle wafer comprises two major, generally parallel surfaces, one of which is the front handle surface of the single crystal silicon handle wafer and the other of which is the back handle surface of the single crystal silicon handle wafer, a circumferential edge joining the front handle surface and the back handle surface of the single crystal silicon handle wafer, a central plane between the front handle surface and the back handle surface of the single crystal silicon handle wafer, and a bulk region between the front and back handle surfaces of the single crystal silicon handle wafer;
(b) forming a front handle silicon nitride layer on the front handle silicon dioxide layer and a back handle silicon nitride layer on the back handle silicon dioxide layer;
(c) bonding the front handle silicon nitride layer to a donor silicon dioxide layer on a front donor surface of a single crystal silicon donor wafer to thereby form a bonded structure, wherein the single crystal silicon donor wafer comprises two major, generally parallel surfaces, one of which is the front donor surface of the single crystal silicon donor wafer and the other of which is the back donor surface of the single crystal silicon donor wafer, a circumferential edge joining the front donor surface and the back donor surface of the single crystal silicon donor wafer, a central plane between the front donor surface and the back donor surface of the single crystal silicon donor wafer, and a bulk region between the front and back donor surfaces of the single crystal silicon donor wafer, and further wherein the single crystal silicon donor wafer comprises a damage layer formed by ion implantation;
(d) removing the back handle silicon nitride layer; and
(e) removing the back handle silicon dioxide layer.

2. The method of claim 1, wherein step (c) occurs before step (d) and before step (e).

3. The method of claim 2, wherein the back handle silicon nitride layer is removed by plasma etching.

4. The method of claim 2, wherein the back handle silicon dioxide layer is removed by wet etching.

5. The method of claim 1, wherein steps (d) and (e) occur before step (c).

6. The method of claim 5, wherein the back handle silicon nitride layer is removed by plasma etching.

7. The method of claim 5, wherein the back handle silicon dioxide layer is removed by wet etching.

8. The method of claim 1, wherein the front handle silicon dioxide layer is formed on the front handle surface of the single crystal silicon handle wafer and the back handle silicon dioxide layer on a back handle surface of the single crystal silicon handle wafer by thermal oxidation.

9. The method of claim 1, wherein the front handle silicon nitride layer is formed on the front handle silicon dioxide layer and the back handle silicon nitride layer is formed on the back handle silicon dioxide layer by low pressure chemical vapor deposition.

10. The method of claim 1, further comprising annealing the single crystal silicon handle wafer comprising the front handle silicon dioxide layer and the front handle silicon nitride layer at a temperature and duration sufficient to densify the front handle silicon dioxide layer, the front handle silicon nitride layer, or both, wherein the anneal occurs prior to bonding the front handle silicon nitride layer to the donor silicon dioxide layer on the front donor surface of a single crystal silicon donor wafer.

11. The method of claim 1, further comprising ion milling the surface of the front handle silicon nitride layer prior to bonding the front handle silicon nitride layer to the donor silicon dioxide layer on the front donor surface of a single crystal silicon donor wafer.

12. The method of claim 1, further comprising chemical mechanical polishing the surface of the front handle silicon nitride layer prior to bonding the front handle silicon nitride layer to the donor silicon dioxide layer on the front donor surface of a single crystal silicon donor wafer.

13. The method of claim 1, further comprising annealing the bonded structure at a temperature and for a duration sufficient to strengthen the bond between the front handle silicon nitride layer and the donor silicon dioxide layer.

14. The method of claim 1, further comprising mechanically cleaving the bonded structure at the damage layer of the single crystal silicon donor wafer to thereby prepare a cleaved structure comprising the single crystal silicon handle wafer, the handle silicon dioxide layer, the handle silicon nitride layer, the donor silicon dioxide layer, and a single crystal silicon device layer.

15. A method of preparing a multilayer structure, the method comprising the following steps in order:
(a) forming a front handle silicon dioxide layer on a front handle surface of a single crystal silicon handle wafer, wherein the single crystal silicon handle wafer comprises two major, generally parallel surfaces, one of which is the front handle surface of the single crystal silicon handle wafer and the other of which is the back handle surface of the single crystal silicon handle wafer, a circumferential edge joining the front handle surface and the back handle surface of the single crystal silicon handle wafer, a central plane between the front handle surface and the back handle surface of the single crystal silicon handle wafer, and a bulk region between the front and back handle surfaces of the single crystal silicon handle wafer;
(b) forming a front handle silicon nitride layer on the front handle silicon dioxide layer;
(c) annealing the single crystal silicon handle wafer comprising the front handle silicon dioxide layer and the front handle silicon nitride layer at a temperature of at least about 900° C. and duration between about 10 minutes and about 10 hours sufficient to densify the front handle silicon dioxide layer, the front handle silicon nitride layer, or both; and
(d) bonding the front handle silicon nitride layer to a donor silicon dioxide layer on a front donor surface of a single crystal silicon donor wafer to thereby form a bonded structure, wherein the single crystal silicon donor wafer comprises two major, generally parallel surfaces, one of which is the front donor surface of the single crystal silicon donor wafer and the other of which is the back donor surface of the single crystal silicon donor wafer, a circumferential edge joining the front donor surface and the back donor surface of the single crystal silicon donor wafer, a central plane between the front donor surface and the back donor surface of the single crystal silicon donor wafer, and a bulk region between the front and back donor surfaces of the single crystal silicon donor wafer, and further wherein the single crystal silicon donor wafer comprises a damage layer formed by ion implantation.

16. The method of claim 15, wherein the front handle silicon dioxide layer is formed on the front handle surface of the single crystal silicon handle wafer and the back handle silicon dioxide layer on a back handle surface of the single crystal silicon handle wafer by plasma enhanced chemical vapor deposition.

17. The method of claim 15, wherein the front handle silicon nitride layer is formed on the front handle silicon dioxide layer and the back handle silicon nitride layer is formed on the back handle silicon dioxide layer by plasma enhanced chemical vapor deposition.

18. The method of claim 15, further comprising annealing the single crystal silicon handle wafer comprising the front handle silicon dioxide layer and the front handle silicon nitride layer at a temperature and duration sufficient to densify the front handle silicon dioxide layer, the front handle silicon nitride layer, or both, wherein the anneal occurs prior to bonding the front handle silicon nitride layer to the donor silicon dioxide layer on the front donor surface of a single crystal silicon donor wafer.

19. The method of claim 15, further comprising ion milling the surface of the front handle silicon nitride layer prior to bonding the front handle silicon nitride layer to the donor silicon dioxide layer on the front donor surface of a single crystal silicon donor wafer.

20. The method of claim 15, further comprising chemical mechanical polishing the surface of the front handle silicon nitride layer prior to bonding the front handle silicon nitride layer to the donor silicon dioxide layer on the front donor surface of a single crystal silicon donor wafer.

21. The method of claim 15, further comprising annealing the bonded structure at a temperature and for a duration sufficient to strengthen the bond between the front handle silicon nitride layer and the donor silicon dioxide layer.

22. The method of claim 15, further comprising mechanically cleaving the bonded structure at the damage layer of the single crystal silicon donor wafer to thereby prepare a cleaved structure comprising the single crystal silicon handle wafer, the handle silicon dioxide layer, the handle silicon nitride layer, the donor silicon dioxide layer, and a single crystal silicon device layer.

23. A method of preparing a multilayer structure, the method comprising:
(a) forming a front donor silicon dioxide layer on a front donor surface of a single crystal silicon donor wafer, wherein the single crystal silicon donor wafer comprises two major, generally parallel surfaces, one of which is the front donor surface of the single crystal silicon donor wafer and the other of which is the back donor surface of the single crystal silicon donor wafer, a circumferential edge joining the front donor surface and the back donor surface of the single crystal silicon donor wafer, a central plane between the front donor surface and the back donor surface of the single crystal silicon donor wafer, and a bulk region between the front and back donor surfaces of the single crystal silicon donor wafer;
(b) forming a front donor silicon nitride layer on the front donor silicon dioxide layer;
(c) annealing the single crystal silicon donor wafer comprising the front donor silicon dioxide layer and the front donor silicon nitride layer for a duration between about 10 minutes and about 10 hours and at a temperature of at least about 900° C. to thereby densify the front donor silicon nitride layer by at least 13%;
(d) implanting ions through the front donor silicon nitride layer and the front donor silicon dioxide layer and into the bulk region of the annealed single crystal silicon donor wafer to thereby form a damage layer; and
(e) bonding the front donor silicon nitride layer to a handle silicon dioxide layer on a front handle surface of a single crystal silicon handle wafer, wherein the single crystal silicon handle wafer comprises two major, generally parallel surfaces, one of which is the front handle surface of the single crystal silicon handle wafer and the other of which is the back handle surface of the single crystal silicon handle wafer, a circumferential edge joining the front handle surface and the back handle surface of the single crystal silicon handle wafer, a central plane between the front handle surface and the back handle surface of the single crystal silicon handle wafer, and a bulk region between the front and back handle surfaces of the single crystal silicon handle wafer.

24. The method of claim 23, wherein the front handle silicon dioxide layer is formed on the front handle surface of the single crystal silicon handle wafer by plasma enhanced chemical vapor deposition or by thermal oxidation.

25. The method of claim 23, wherein the front donor silicon dioxide layer is formed on the front donor surface of the single crystal silicon donor wafer by plasma enhanced chemical vapor deposition or by thermal oxidation.

26. The method of claim 23, wherein the front donor silicon nitride layer is formed on the front donor silicon dioxide layer by low pressure chemical vapor deposition or by plasma enhanced chemical vapor deposition.

27. The method of claim 23, further comprising ion milling the surface of the front donor silicon nitride layer prior to bonding the front donor silicon nitride layer to the handle silicon dioxide layer on the front donor surface of a single crystal silicon donor wafer.

28. The method of claim 23, further comprising chemical mechanical polishing the surface of the front donor silicon nitride layer prior to bonding the front donor silicon nitride layer to the handle silicon dioxide layer on the front handle surface of a single crystal silicon donor wafer.

29. The method of claim 23, further comprising annealing the bonded structure at a temperature and for a duration sufficient to strengthen the bond between the handle silicon dioxide layer and the donor silicon nitride layer.

30. The method of claim 23, further comprising mechanically cleaving the bonded structure at the damage layer of the single crystal silicon donor wafer to thereby prepare a cleaved structure comprising the single crystal silicon handle wafer, the handle silicon dioxide layer, the donor silicon nitride layer, the donor silicon dioxide layer, and a single crystal silicon device layer.

* * * * *